United States Patent
Lee et al.

(10) Patent No.: US 10,181,548 B2
(45) Date of Patent: Jan. 15, 2019

(54) LIGHT EMITTING DIODE WITH HIGH EFFICIENCY

(71) Applicant: Seoul Viosys Co., Ltd., Ansan-si (KR)

(72) Inventors: Keum Ju Lee, Ansan-si (KR); Seom Geun Lee, Ansan-si (KR); Kyoung Wan Kim, Ansan-si (KR); Yong Woo Ryu, Ansan-si (KR); Mi Na Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/490,492

(22) Filed: Apr. 18, 2017

(65) Prior Publication Data

US 2017/0301826 A1 Oct. 19, 2017

(30) Foreign Application Priority Data

Apr. 18, 2016 (KR) .......................... 10-2016-0047054
Feb. 14, 2017 (KR) .......................... 10-2017-0020233

(51) Int. Cl.
*H01L 33/14* (2010.01)
*H01L 27/15* (2006.01)
(Continued)

(52) U.S. Cl.
CPC ............ *H01L 33/145* (2013.01); *H01L 27/15* (2013.01); *H01L 27/156* (2013.01); *H01L 33/06* (2013.01); *H01L 33/10* (2013.01); *H01L 33/32* (2013.01); *H01L 33/42* (2013.01); *H01L 33/62* (2013.01); *H01L 2224/48091* (2013.01); *H01L 2224/48137* (2013.01)

(58) Field of Classification Search
CPC ..... H01L 33/145; H01L 33/06; H01L 33/385; H01L 33/387; H01L 33/42; H01L 27/156
See application file for complete search history.

(56) References Cited

U.S. PATENT DOCUMENTS

| 2014/0034977 A1* | 2/2014 | Yang ...................... H01L 33/08 257/93 |
| 2014/0145218 A1* | 5/2014 | Kim ........................ H01L 33/20 257/88 |

(Continued)

*Primary Examiner* — Phat X Cao
(74) *Attorney, Agent, or Firm* — H.C. Park & Associates, PLC

(57) ABSTRACT

A light emitting diode includes: a substrate; a semiconductor stack disposed on the substrate and including a lower semiconductor layer, an upper semiconductor layer and an active layer interposed between the lower semiconductor layer and the upper semiconductor layer, the semiconductor stack having an isolation groove exposing the substrate through the upper semiconductor layer, the active layer and the lower semiconductor layer; a first electrode pad and an upper extension portion electrically connected to the upper semiconductor layer; a second electrode pad and a lower extension portion electrically connected to the lower semiconductor layer; a connecting portion connecting the upper extension portion and the lower extension portion to each other across the isolation groove; a first current blocking layer interposed between the lower extension portion and the lower semiconductor layer; and a second current blocking layer interposed between the second electrode pad and the lower semiconductor layer.

21 Claims, 14 Drawing Sheets

(51) Int. Cl.
*H01L 33/06* (2010.01)
*H01L 33/10* (2010.01)
*H01L 33/32* (2010.01)
*H01L 33/42* (2010.01)
*H01L 33/62* (2010.01)

(56) References Cited

U.S. PATENT DOCUMENTS

2015/0129900 A1* 5/2015 Yang .................. H01L 33/46
257/88
2015/0146426 A1* 5/2015 Yeh .................. H01L 27/156
362/249.06

\* cited by examiner

A-A

B-B

C-C

D-D

E-E

F-F

G-G

LIGHT EMITTING DIODE WITH HIGH EFFICIENCY

CROSS-REFERENCE TO RELATED APPLICATION

This application claims priority from and the benefit of Korean Patent Application No. 10-2016-0047054, filed on Apr. 18, 2016, Korean Patent Application No. 10-2016-0149627, filed on Nov. 10, 2016, and Korean Patent Application No. 10-2017-0020233, filed on Feb. 14, 2017, all of which are incorporated by reference for all purposes as if fully set forth herein.

BACKGROUND

Field

Exemplary embodiments of the present disclosure relate to a light emitting diode, and more particularly, to a light emitting diode with high luminous efficacy.

Discussion of the Background

A light emitting diode (LED) refers to a solid state light emitting device that converts electrical energy into light. Light emitting diodes are broadly used as light sources for backlight units, lighting apparatus, traffic signals, large displays, and the like. With increasing demand for LEDs for lighting and expansion of application range to high current density and high output fields, there is a need for improvement in characteristics of LEDs for stable operation upon high current driving.

Generally, the intensity of light output from a light emitting diode increases with increasing current density applied to a light emitting diode. However, an increase in current density causes a decrease in external quantum efficiency, that is, a droop phenomenon. The droop phenomenon increases light loss with increasing current density and obstructs improvement in luminous efficacy as measured in lm/W.

SUMMARY

Exemplary embodiments of the present disclosure provide a light emitting diode suitable for a light emitting device with high luminous efficacy.

Exemplary embodiments of the present disclosure provide a light emitting diode that suppresses a droop phenomenon.

Exemplary embodiments of the present disclosure provide a light emitting diode that prevents disconnection of a connecting portion which electrically connects at least two light emitting cells to each other.

In accordance with one exemplary embodiment of the present disclosure, a light emitting diode includes: a substrate; first to fourth light emitting cells disposed on the substrate; a first electrode pad; and a second electrode pad, wherein each of the light emitting cells includes a lower semiconductor layer, an upper semiconductor layer, and an active layer interposed between the lower semiconductor layer and the upper semiconductor layer; the lower semiconductor layer includes a first lower semiconductor layer and a second lower semiconductor layer separated from each other; the first light emitting cell and the second light emitting cell share the first lower semiconductor layer; the third light emitting cell and the fourth light emitting cell share the second lower semiconductor layer; the first light emitting cell is connected in series to the third light emitting cell; the second light emitting cell is connected in series to the fourth light emitting cell; the first electrode pad is electrically connected to the upper semiconductor layers of the first light emitting cell and the second light emitting cell; and the second electrode pad is electrically connected to the lower semiconductor layers of the third light emitting cell and the fourth light emitting cell.

In accordance with another exemplary embodiment of the present disclosure, a light emitting diode includes: a substrate; a semiconductor stack disposed on the substrate and including a lower semiconductor layer, an upper semiconductor layer and an active layer interposed between the lower semiconductor layer and the upper semiconductor layer, the semiconductor stack having an isolation groove exposing the substrate through the upper semiconductor layer, the active layer and the lower semiconductor layer; a first electrode pad and an upper extension portion electrically connected to the upper semiconductor layer; a second electrode pad and a lower extension portion electrically connected to the lower semiconductor layer; a connecting portion connecting the upper extension portion and the lower extension portion to each other across the isolation groove and having a greater width than the upper extension portion and the lower extension portion; a first current blocking layer interposed between the lower extension portion and the lower semiconductor layer; and a second current blocking layer interposed between the second electrode pad and the lower semiconductor layer, wherein the first current blocking layer includes a plurality of dots separated from one another, a width each of the dots is greater than the width of the lower extension portion, the second current blocking layer has a smaller width than the second electrode pad, and the shortest distance from the isolation groove to the first current blocking layer is greater than a separation distance between the dots.

According to exemplary embodiments, the light emitting diode includes a plurality of light emitting cells arranged on a substrate such that the light emitting cells are connected to each other in series or in parallel. With the structure wherein the light emitting cells are connected to each other in series, the light emitting diode can be driven with low current, thereby improving luminous efficacy through reduction in current density. In addition, with the structure wherein the light emitting cells are connected to each other in parallel, the light emitting diode allow electric current input to the light emitting cells to be uniformly spread to the light emitting cells, thereby suppressing the droop phenomenon. Further, the light emitting diode includes the current blocking layer interposed between the lower semiconductor layer and the lower extension portion and having a greater width than the lower extension portion to prevent current crowding in a particular region while allowing the current to spread over a wide region of the light emitting cell, thereby further suppressing the droop phenomenon.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1:
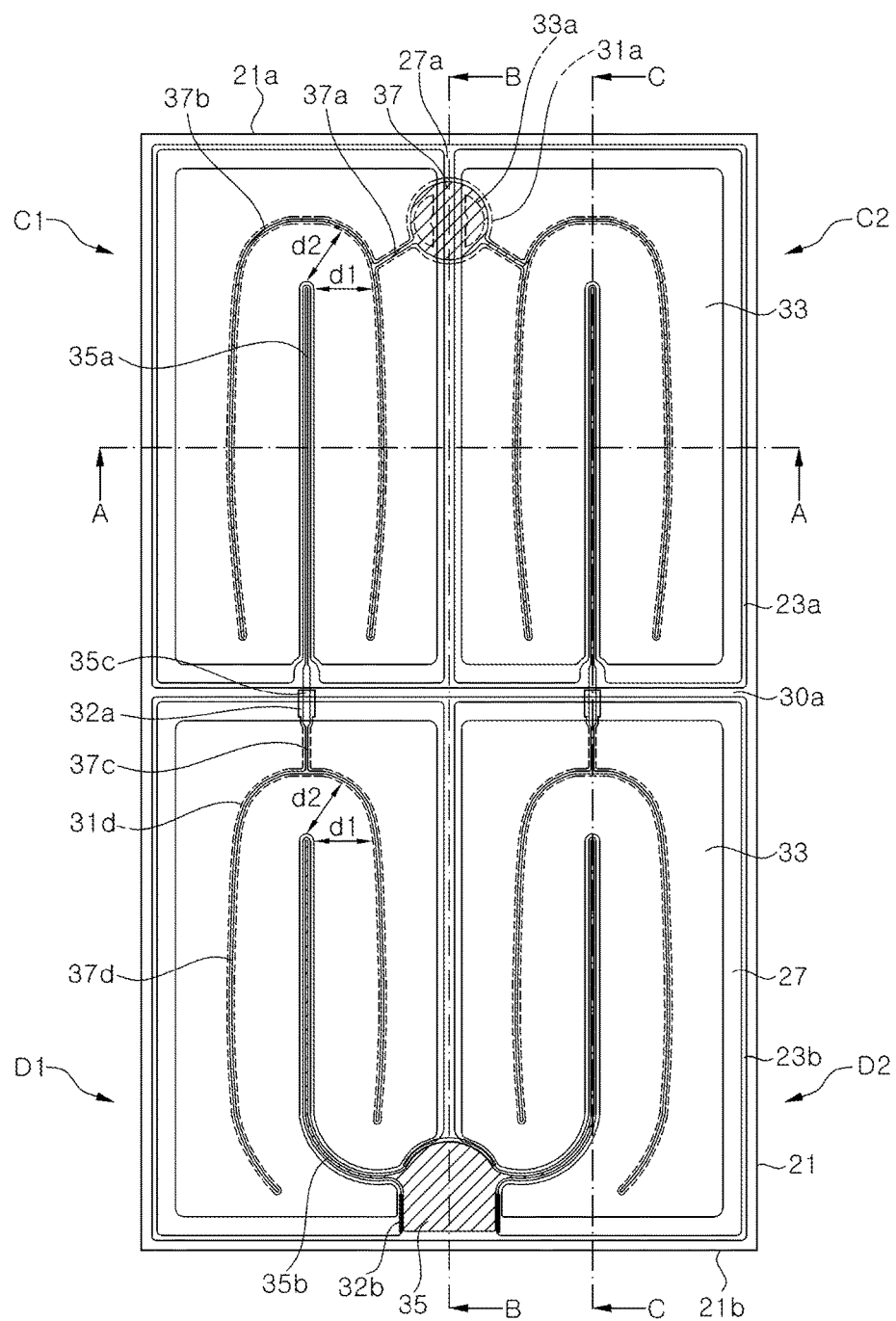
FIG. 1 is a plan view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. It will be understood that, when an element such as a layer, film, region or substrate is referred to as being "on" another element, it can be directly on the other element or intervening elements may also be present. In contrast, when an element is referred to as being "directly on" another element, there are no intervening elements present. Throughout the specification, like reference numerals denote like elements having the same or similar functions. Also, the singular forms "a", "an", and "the" are intended to include the plural forms as well, unless the context clearly indicates otherwise. It will be further understood that the terms "comprises" and/or "comprising", "includes" and/or "including", "have" and/or "having" when used in this specification, specify the presence of stated features, integers, steps, operations, elements and/or components, but do not preclude the presence or addition of one or more other features, integers, steps, operations, elements, components, and/or groups thereof.

In accordance with one exemplary embodiment of the present disclosure, a light emitting diode includes: a substrate; first to fourth light emitting cells disposed on the substrate; a first electrode pad; and a second electrode pad. In this exemplary embodiment, each of the light emitting cells includes a lower semiconductor layer, an upper semiconductor layer, and an active layer interposed between the lower semiconductor layer and the upper semiconductor layer, wherein the lower semiconductor layer includes a first lower semiconductor layer and a second lower semiconductor layer separated from each other; the first light emitting cell and the second light emitting cell share the first lower semiconductor layer; the third light emitting cell and the fourth light emitting cell share the second lower semiconductor layer; the first light emitting cell is connected in series to the third light emitting cell; the second light emitting cell is connected in series to the fourth light emitting cell; the first electrode pad is electrically connected to the upper semiconductor layer of each of the first light emitting cell and the second light emitting cell; and the second electrode pad is electrically connected to the lower semiconductor layers of the third light emitting cell and the fourth light emitting cell. Accordingly, the light emitting diodes include the light emitting cells connected to each other in series-parallel connection, and thus can reduce current density for driving and can achieve uniform current spreading to the light emitting cells, thereby improving luminous efficacy.

In addition, since the first and second light emitting cells share the first lower semiconductor layer and the third and fourth light emitting cells share the second lower semiconductor layer, the light emitting diode according to this exemplary embodiment allow a simple manufacturing process and can minimize reduction in luminous area due to isolation between light emitting cells.

Specifically, the first lower semiconductor layer and the second lower semiconductor layer may be isolated from each other by an isolation groove exposing an upper surface of the substrate, and the first light emitting cell and the third light emitting cell may be isolated from the second light emitting cell and the fourth light emitting cell by a mesa isolation grove exposing the first lower semiconductor layer and the second lower semiconductor layer, respectively.

In some exemplary embodiments, the light emitting diode may further include a transparent electrode layer disposed on the upper semiconductor layer of each of the light emitting cells.

The first electrode pad may be disposed on the mesa isolation groove and may straddle the first light emitting cell and the second light emitting cell. Here, the transparent electrode layer may be disposed between each of the first and second light emitting cells and the first electrode pad.

The light emitting diode may further include a current blocking layer disposed under the first electrode pad. The current blocking layer may have a larger area than the first electrode pad such that the first electrode pad is placed only in an upper region of the current blocking layer, and a portion of the current blocking layer may be disposed between each of the first and second light emitting cells and the transparent electrode layer.

The transparent electrode layer on each of the first and second light emitting cells may include an opening exposing the current blocking layer, and the first electrode pad may be connected to the current blocking layer through the opening.

The light emitting diode may further include upper extension portions disposed on the transparent electrode layer of each of the light emitting cells and electrically connected to the transparent electrode layer; and current blocking layers disposed between the transparent electrode layers and the light emitting cells under the upper extension portions. A width of each of the current blocking layers may be less than three times the width of each of the upper extension portions. The current blocking layers aid in uniform current spreading over a light emitting cell region. In addition, light loss by the current blocking layers can be reduced by adjusting the width of the current blocking layer.

The light emitting diode may further include a lower extension portion connected to the lower semiconductor layer of each of the light emitting cells. The lower extension portions may include linear regions extending in the same direction, the linear region of the lower extension portion of the first light emitting cell may be parallel to the linear region of the lower extension portion of the third light emitting cell, and the linear region of the lower extension portion of the second light emitting cell may be parallel to the linear region of the lower extension portion of the fourth light emitting cell.

The upper extension portions disposed on the transparent electrode layers of the first light emitting cell and the second light emitting cell are electrically connected to the first electrode pad, and the lower extension portions connected to the lower semiconductor layers of the third light emitting cell and the fourth light emitting cell are electrically connected to the second electrode pad. Thus, the light emitting cells are connected in series-parallel between the first electrode pad and the second electrode pad.

Each of the upper extension portions may include a primary upper extension portion configured to surround a portion of the corresponding lower extension portion and a secondary upper extension portion protruding from the primary upper extension portion.

The secondary upper extension portion on each of the first light emitting cell and the second light emitting cell may be disposed to connect the primary upper extension portion to the first electrode pad, and the secondary upper extension portions on the third light emitting cell and the fourth light emitting cell may be disposed to connect the primary upper extension portions on the third light emitting cell and the fourth light emitting cell to the lower extension portions of the first light emitting cell and the second light emitting cell, respectively.

The secondary upper extension portions on the first light emitting cell and the second light emitting cell may be connected to the primary upper extension portions closer to the mesa isolation groove than the corresponding lower extension portions. Thus, the lengths of the secondary upper extension portions can be reduced.

The light emitting diode may further include connecting portions which connect the lower extension portions on the first and second light emitting cells to the secondary upper extension portions on the third and fourth light emitting cells, respectively. The light emitting diode may further include an insulating layer insulating the connecting portions from the second lower semiconductor layers of the third light emitting cell and the fourth light emitting cell.

The lower extension portions of the third light emitting cell and the fourth light emitting cell may further include lower extension portions in a curved region connecting the lower extension portions in the linear region to the second electrode pad. Furthermore, the second electrode pad may be disposed on the second lower semiconductor layer exposed by the mesa isolation groove.

The light emitting diode may further include an insulating layer covering side surfaces of the upper semiconductor layer and the active layer around the second electrode pad. The insulating layer can prevent short circuit by a bonding material in a ball-bonding process.

The insulating layer covering the side surfaces of the upper semiconductor layer and the active layer may be separated from the transparent electrode layer.

In some exemplary embodiments, the first electrode pad and the second electrode pad may be disposed to face each other, wherein the first electrode pad may be disposed near one edge of the substrate and the second electrode pad may be disposed near the other edge of the substrate facing the one edge thereof.

Each of the primary upper extension portions on the third light emitting cell and the fourth light emitting cell may include an inner end disposed between the lower extension portion of the third light emitting cell and the lower extension portion of the fourth light emitting cell, and an outer end disposed outside the lower extension portion, and the outer end of the lower extension portion may be disposed closer to the other edge of the substrate than the inner end.

The light emitting diode may have a symmetrical structure with respect to an imaginary line passing through the first electrode pad and the second electrode pad.

In accordance with another exemplary embodiment of the present disclosure, a light emitting diode includes: a substrate; a semiconductor stack disposed on the substrate and including a lower semiconductor layer, an upper semiconductor layer and an active layer interposed between the lower semiconductor layer and the upper semiconductor layer, the semiconductor stack having an isolation groove exposing the substrate through the upper semiconductor layer, the active layer and the lower semiconductor layer; a first electrode pad and an upper extension portion electrically connected to the upper semiconductor layer; a second electrode pad and a lower extension portion electrically connected to the lower semiconductor layer; a connecting portion connecting the upper extension portion and the lower extension portion to each other across the isolation groove and having a greater width than the upper extension portion and the lower extension portion; a first current blocking layer interposed between the lower extension portion and the lower semiconductor layer; and a second current blocking layer interposed between the second electrode pad and the lower semiconductor layer, wherein the first current blocking layer includes a plurality of dots separated from one another, a width each of the dots is greater than the width of the lower extension portion, the second current blocking layer has a smaller width than the second electrode pad, and the shortest distance from the isolation groove to the first current blocking layer is greater than a separation distance between the dots.

A connection region in which the connecting portion and the lower extension portion are connected to the lower semiconductor layer between the isolation groove and the current blocking layer may have a greater length than a connection region in which the lower extension portion is connected to the lower semiconductor layer between two adjacent dots.

The upper extension portion may be separated from the lower extension portion and a distal end of the lower extension portion may be directly connected to the lower semiconductor layer. The upper extension portion may be disposed to surround the distal end of the lower extension portion.

In this structure, a diagonal distance from the distal end of the lower extension portion to the upper extension portion may be greater than a horizontal distance from the distal end of the lower extension portion to the upper extension portion. Here, the horizontal distance means a distance from the distal end of the lower extension portion to the upper extension portion in a horizontal direction that is parallel to the substrate, and the diagonal distance means a distance from the distal end of the lower extension portion to the upper extension portion in a slanted direction with respect to the horizontal direction.

The first current blocking layer and the second current blocking layer may include an $SiO_2$ layer or a distributed Bragg reflector layer.

The light emitting diode may further include a transparent electrode layer disposed on the upper semiconductor layer, wherein a part of the transparent electrode layer may be disposed between the upper semiconductor layer and the first electrode pad and between the upper semiconductor layer and the upper extension portion.

The light emitting diode may further include a third current blocking layer disposed between the upper semiconductor layer and the transparent electrode layer under the first electrode pad.

The transparent electrode layer may have an opening exposing the third current blocking layer and the first electrode pad may be connected to the third current blocking layer through the opening. The third current blocking layer may have a larger area than the first electrode pad such that the first electrode pad is disposed only on the third current blocking layer.

The semiconductor stack may include a plurality of light emitting cells defined by the isolation groove or the mesa isolation groove and each of the plurality of light emitting cells may include the lower extension portion and the upper extension portion.

The connecting portion may be disposed on the isolation groove and electrically connect the upper extension portion and the lower extension portion of two adjacent light emitting cells.

The plurality of light emitting cells may include first to fourth light emitting cells; the lower semiconductor layer may include a first lower semiconductor layer and a second lower semiconductor layer separated from each other by the isolation groove; the first light emitting cell and the second light emitting cell may share the first lower semiconductor layer; the third light emitting cell and the fourth light emitting cell may share the second lower semiconductor layer; the first light emitting cell may be connected in series to the third light emitting cell through the connecting portion; and the second light emitting cell may be connected in series to the fourth light emitting cell through the connecting portion.

The lower extension portions of the light emitting cells may include linear regions extending in the same direction; the linear region of the lower extension portion of the first light emitting cell may be coaxial with the linear region of the lower extension portion of the third light emitting cell; and the linear region of the lower extension portion of the second light emitting cell may be coaxial with the linear region of the lower extension portion of the fourth light emitting cell.

The first electrode pad may be disposed on the mesa isolation groove so as to straddle the first light emitting cell and the second light emitting cell, and the second electrode pad may be disposed on the mesa isolation groove so as to be electrically connected to the second lower semiconductor layer.

The upper extension portion disposed on the transparent electrode layer of each of the first light emitting cell and the second light emitting cell may be electrically connected to the first electrode pad, and the lower extension portion disposed on the lower semiconductor layer of each of the third light emitting cell and the fourth light emitting cell may be electrically connected to the second electrode pad.

The upper extension portion of each of the light emitting cells may include a primary upper extension portion configured to surround a portion of the corresponding lower extension portion and a secondary upper extension portion protruding from the primary upper extension portion.

The secondary upper extension portion on each of the first light emitting cell and the second light emitting cell may be disposed to connect the primary upper extension portion to the first electrode pad, and the secondary upper extension portions on the third light emitting cell and the fourth light emitting cell may be disposed to connect the primary upper extension portions on the third light emitting cell and the fourth light emitting cell to the lower extension portions of the first light emitting cell and the second light emitting cell, respectively.

The first light emitting cell and the third light emitting cell may be connected in parallel to the second light emitting cell and the fourth light emitting cell through the first electrode pad and the second electrode pad.

Each of the light emitting cells may include a step on a side surface of the substrate, and the side surface of the substrate may be exposed.

Hereinafter, exemplary embodiments of the present disclosure will be described in detail with reference to the accompanying drawings.

Figure 2:
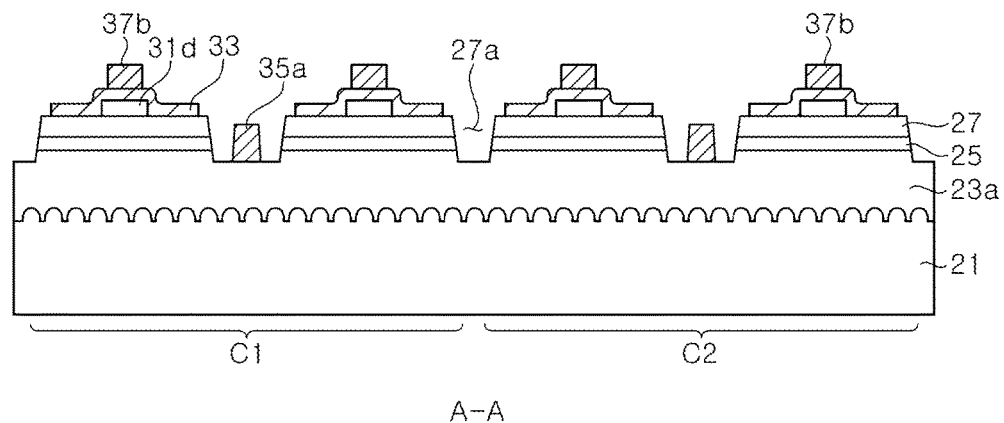
FIG. 2 is a cross-sectional view taken along line A-A of FIG. 1.
Figure 3:
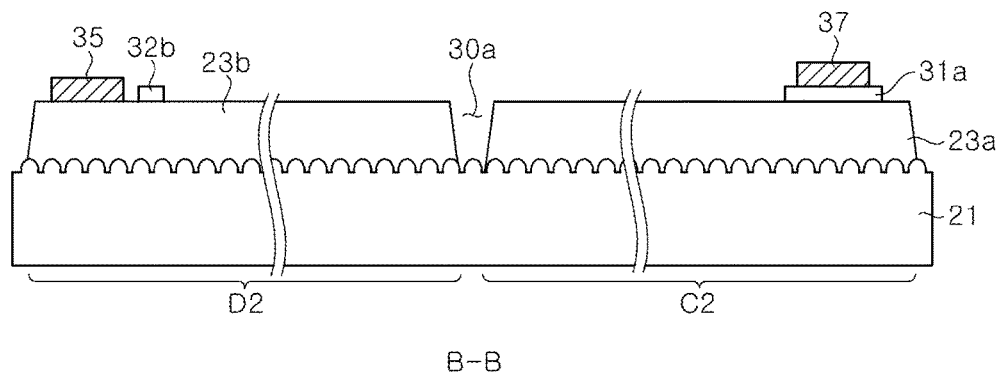
FIG. 3 is a cross-sectional view taken along line B-B of FIG. 1.
Figure 4:
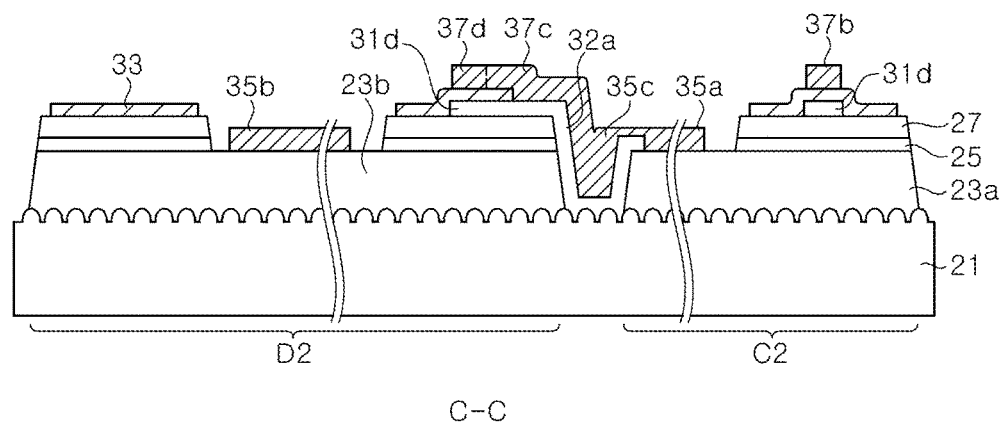
FIG. 4 is a cross-sectional view taken along line C-C of FIG. 1.
Figure 5:
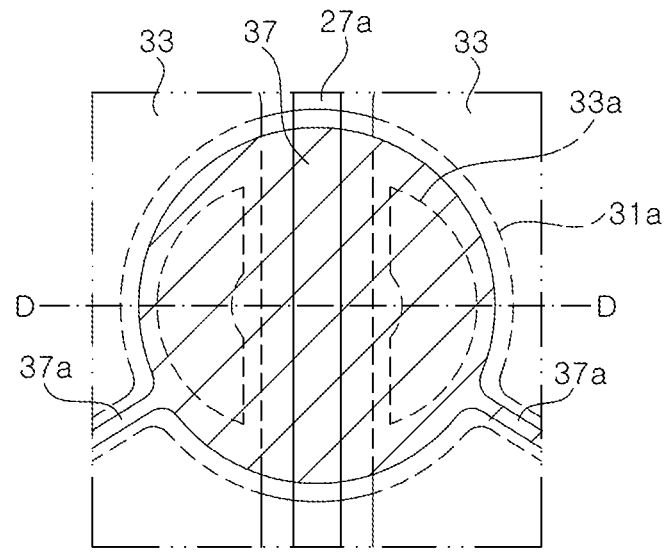
FIG. 5 is an enlarged plan view of a first electrode pad of FIG. 1
Figure 6:
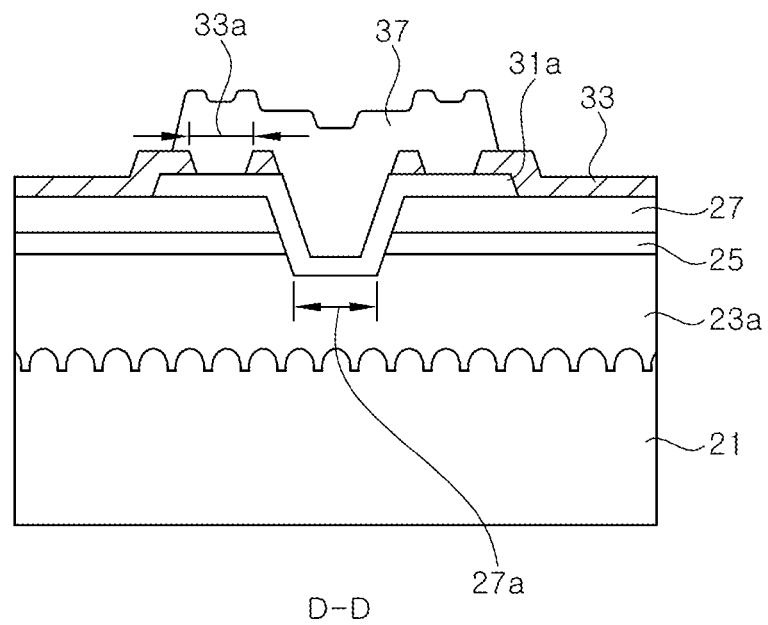
FIG. 6 is a cross-sectional view taken along line D-D of FIG. 5.
Figure 7:
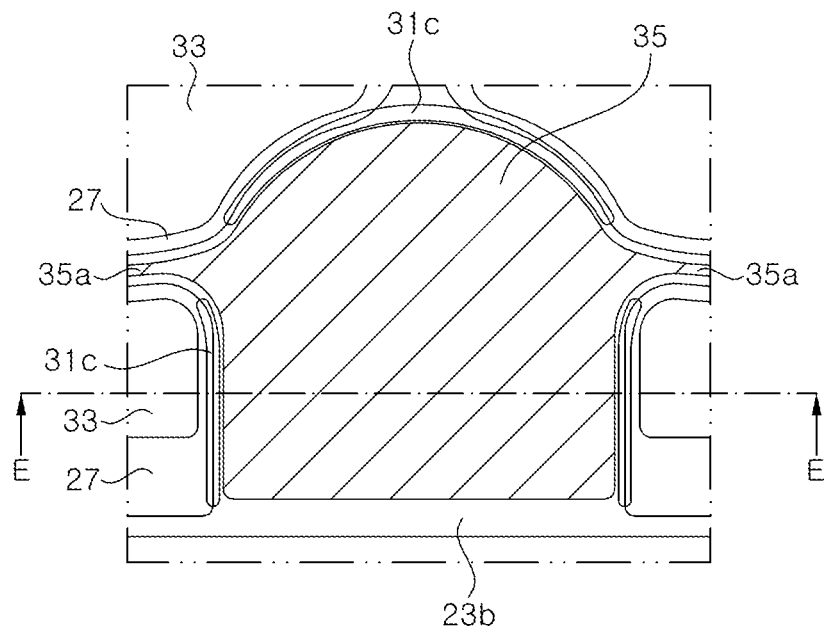
FIG. 7 is an enlarged plan view of a second electrode pad of FIG. 1
Figure 8:
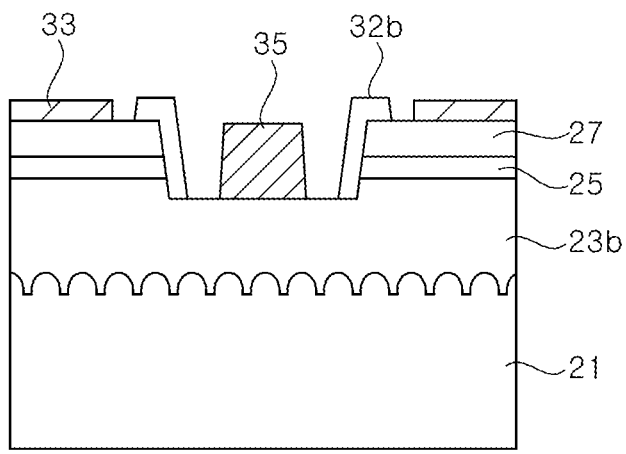
FIG. 8 is a cross-sectional view taken along line E-E of FIG. 7.

FIG. 1 is a plan view of a light emitting diode according to one exemplary embodiment of the present disclosure, FIG. 2 is a cross-sectional view taken along line A-A of FIG. 1, FIG. 3 is a cross-sectional view taken along line B-B of FIG. 1, and FIG. 4 is a cross-sectional view taken along line C-C of FIG. 1. FIG. 5 is an enlarged plan view of a first electrode pad of FIG. 1 and FIG. 6 is a cross-sectional view taken along line D-D of FIG. 5. FIG. 7 is an enlarged plan view of second electrode pads of FIG. 1 and FIG. 8 is a cross-sectional view taken along line E-E of FIG. 7.

Referring to FIG. 1, the light emitting diode according to this exemplary embodiment includes a first light emitting cell C1, a second light emitting cell C2, a third light emitting cell D1, and a fourth light emitting cell D2 disposed on a substrate 21. In addition, the light emitting diode includes a first electrode pad 37, a second electrode pad 35, upper extension portions 37*a*, 37*b*, 37*c*, 37*d*, lower extension portions 35*a*, 35*b*, connecting portions 35*c*, current blocking layers 31*a*, 31*d*, insulating layers 32*a*, 32*b*, and a transparent electrode layer 33. As best shown in FIG. 2 to FIG. 4, each of the light emitting cells C1, C2, D1, D2 includes a lower semiconductor layer 23*a* or 23*b*, an active layer 25, and an upper semiconductor layer 27.

The substrate 21 may be selected from any substrates suitable for growth of a gallium nitride-based semiconductor layer. For example, the substrate 21 may include a sapphire substrate, a silicon carbide substrate, a gallium nitride substrate, an aluminum nitride substrate, a silicon substrate, and the like. In this exemplary embodiment, the substrate 21 may be a patterned sapphire substrate (PSS).

The lower semiconductor layers 23*a*, 23*b*, the active layer 25 and the upper semiconductor layer 27 may be Group III-V based, particularly, gallium nitride-based compound semiconductor layers. These semiconductor layers may include, for example, a nitride semiconductor, such as (Al, Ga, In)N. The lower semiconductor layers 23*a*, 23*b* may include n-type dopants (for example, Si) and the upper semiconductor layer 27 may include p-type dopants (for example, Mg), or vice versa. The active layer 25 may have a multi-quantum well (MQW) structure and the composition of the active layer 25 may be adjusted to emit light in a desired wavelength range. The first to fourth light emitting cells C1, C2, D1, D2 may be formed by sequentially growing the lower semiconductor layers 23a, 23b, the active layer 25 and the upper semiconductor layer 27 on the substrate 21, followed by patterning these semiconductor layers. These semiconductor layers may be grown by, for example, metal organic vapor deposition, molecular beam epitaxy, hydride vapor phase epitaxy, and the like.

The first light emitting cell C1 and the second light emitting cell C2 are isolated from the third light emitting cell D1 and the fourth light emitting cell D2 by an isolation groove 30a, respectively, and the first light emitting cell C1 and the third light emitting cell D1 are isolated from the second light emitting cell C2 and the fourth light emitting cell D2 by a mesa isolation groove 27a, respectively. That is, the first and second light emitting cells C1, C2 are isolated from the third and fourth light emitting cells D1, D2, respectively, by an isolation process, in which the isolation groove 30a is formed to expose the substrate 21. Meanwhile, the first light emitting cell C1 and the third light emitting cell D1 are isolated from the second light emitting cell C2 and the fourth light emitting cell D2, respectively, by a mesa etching process, in which the mesa isolation groove 27a is formed to expose the lower semiconductor layers 23a, 23b. In this structure, the first light emitting cell C1 and the second light emitting cell C2 share a first lower semiconductor layer 23a, and the third light emitting cell D1 and the fourth light emitting cell D2 share a second lower semiconductor layer 23b. Further, the first lower semiconductor layer 23a and the second lower semiconductor layer 23b are separated from each other by the isolation groove 30a.

Referring to FIG. 2, other electrode portions are not disposed in the mesa isolation groove 27a except for the first electrode pad 37 and the second electrode pad 35, and the lower semiconductor layers 23a, 23b may be exposed through the mesa isolation groove 27a.

The first light emitting cell C1 may have the same shape as the second light emitting cell C2 and the third light emitting cell D1 may have the same shape as the fourth light emitting cell D2. Here, due to the structure of the second electrode pad 35, the third light emitting cell D1 and the fourth light emitting cell D2 may have a slightly different shape than the first light emitting cell C1 and the second light emitting cells C1, C2, D1, D2 may generally have an elongated rectangular shape.

The first electrode pad 37 is disposed near one edge 21a of the substrate 21 and the second electrode pad 35 is disposed near the other edge 21b of the substrate 21 facing the one edge 21a. As shown in FIG. 1, the first electrode pad 37 and the second electrode pad 35 may be disposed to face each other. The first electrode pad 37 and the second electrode pad 35 are disposed on the mesa isolation groove 27a. In addition, the first electrode pad 37 may be formed to straddle the first light emitting cell C1 and the second light emitting cell C2. The first electrode pad 37 and the second electrode pad 35 will be described in detail below with reference to FIG. 5 and FIG. 7.

The transparent electrode layer 33 is disposed on each of the light emitting cells. The transparent electrode layer 33 is connected to the upper semiconductor layer 27. The transparent electrode layer 33 may be formed of a light transmissive and electrically conductive material, for example, a conductive oxide such as ITO, ZnO and IZO or a light transmissive metal such as Ni/Au. The transparent electrode layer 33 has lower sheet resistance than the upper semiconductor layer 27 and thus serves to distribute electric current over a wide area. In addition, the transparent electrode layer 33 forms ohmic contact with the upper semiconductor layer 27 to input electric current to the upper semiconductor layer 27.

The lower semiconductor layer 23a or 23b is exposed through the upper semiconductor layer 27 and the active layer 25 of each of the light emitting cells, and the lower extension portion 35a or 35b is disposed in an exposed region of the lower semiconductor layer 23a or 23b. The lower extension portions 35a, 35b are electrically connected to the lower semiconductor layers 23a, 23b.

The lower extension portions 35a disposed on the first light emitting cell C1 and the second light emitting cell C2 may include linear regions, respectively, and the linear regions may be parallel to each other. In addition, as shown in FIG. 1 and FIG. 4, the lower extension portion 35a of the first light emitting cell C1 may be coaxial with a linear region of the lower extension portion 35b of the third light emitting cell D1.

Each of the lower extension portions 35b disposed on the third light emitting cell D1 and the fourth light emitting cell D2 may be connected to the second electrode pad 35 and may include the linear region and a curved region. The curved region of the lower extension portion may connect the linear region thereof to the second electrode pad 35. The lower extension portions 35b in the linear regions on the third light emitting cell D1 and the fourth light emitting cell D2 may be parallel to each other. Further, the lower extension portion 35b may extend along the center of each of the light emitting cells D1, D2.

The upper extension portions 37a, 37b, 37c, 37d are disposed on the transparent electrode layer 33. A secondary upper extension portion 37a and a primary upper extension portion 37b are disposed on each of the first and second light emitting cells C1, C2, and a secondary upper extension portion 37c and a primary upper extension portion 37d are disposed on each of the third and fourth light emitting cells D1, D2.

The primary upper extension portion 37b disposed on each of the first light emitting cell C1 and the second light emitting cell C2 surrounds a distal end of the lower extension portion 35a and a portion of a side surface thereof. Herein, the inside of the lower extension portion 35a means a side of the lower extension portion 35a that is closer to the mesa isolation groove 27a, and the outside of the lower extension portion 35a means the other side of the lower extension portion 35a. In this structure, a portion of the primary upper extension portion 37b is disposed outside the lower extension portion 35a, another portion thereof is disposed inside the lower extension portion 35a, and a third portion thereof is disposed between the distal end of the lower extension portion 35a and the one edge 21a of the substrate 21. In addition, the primary upper extension portion 37b has two ends, which are placed inside and outside the lower extension portion 35a, respectively. The primary upper extension portion 37b may have a symmetrical structure with respect to a straight line extending from the lower extension portion 35a.

The primary upper extension portion 37b extends from the one edge 21a side of the substrate 21, at which the first electrode pad 37 is disposed, towards the other edge 21b side thereof, at which the second electrode pad 35 is disposed. As shown in FIG. 1, the distance between the primary upper extension portion 37b and the lower extension portion 35a may be variable. For example, the distance between the primary upper extension portion 37b and the lower extension portion 35a may increase and then decrease along an imaginary line extending from the primary upper extension portion 37b. The distance from the lower extension portion 35a to the primary upper extension portion 37b may be generally greater than the distance from the primary upper extension portion 37b to an edge of a first lower semiconductor layer 23a or to the mesa isolation groove 27a. Here, the distance from an inner end (on the inside of the lower extension portion 35a) or outer end (the outside of the lower extension portion 35a) of the primary upper extension portion 37b to the lower extension portion 35a may be shorter than the distance from the outer end thereof to the edge of the first lower semiconductor layer 23a or the distance from the inner end thereof to the mesa isolation groove 27a. With this structure, the light emitting diode can prevent current crowding at corners of the first light emitting cell C1 or the second light emitting cell C2, thereby achieving uniform current spreading.

The secondary upper extension portion 37a disposed on each of the first light emitting cell C1 and the second light emitting cell C2 connects the first electrode pad 37 to the primary upper extension portion 37b. The secondary upper extension portion 37a may have a linear shape and is connected at one end thereof to the first electrode pad 37 and at the other end thereof to the primary upper extension portion 37b. A connection point at one end of the secondary upper extension portion 37a is farther from the one edge 21a of the substrate 21 than from the center of the first electrode pad 37. In addition, a connection point at the other end of the secondary upper extension portion 37a may be disposed inside the lower extension portion 35a and may be closer to the one edge 21a of the substrate than the distal end of the lower extension portion 35a.

The primary upper extension portion 37d disposed on each of the third light emitting cell D1 and the fourth light emitting cell D2 surrounds a distal end of the lower extension portion 35b and a portion of a side surface thereof. Herein, the inside of the lower extension portion 35b means a side of the lower extension portion 35b that is closer to the mesa isolation groove 27a, and the outside of the lower extension portion 35b means the other side of the lower extension portion 35b. In this structure, a portion of the primary upper extension portion 37d is disposed outside the lower extension portion 35b, another portion thereof is disposed inside the lower extension portion 35b, and a third portion thereof is disposed between the distal end of the lower extension portion 35b and the isolation groove 30a. In addition, the primary upper extension portion 37d has two ends, that is, an inner end and an outer end, which are placed inside and outside the lower extension portion 35b, respectively.

The primary upper extension portion 37d extends from the isolation groove 30a to the other edge 21b of the substrate 21, at which the second electrode pad 35 is disposed. As shown in FIG. 1, the distance between the primary upper extension portion 37d and the lower extension portion 35b may be variable. For example, the distance between the primary upper extension portion 37d and the lower extension portion 35b may increase and then decrease along an imaginary line extending from the primary upper extension portion 37d.

Although the primary upper extension portion 37d may generally have a symmetrical structure with respect to the linear region of the lower extension portion 35b, the outer end of the lower extension portion 35b is disposed closer to the other edge 21b of the substrate 21 than the inner end of the primary upper extension portion 37d. That is, as shown in FIG. 1, a region of the primary upper extension portion 37d disposed outside the lower extension portion 35b is longer than a region thereof disposed inside the lower extension portion 35b and may be curved along the curved region of the lower extension portion 35b.

The distance between the distal end of the lower extension portion 35a or 35b and the primary upper extension portion 37b or 37d surrounding the distal end of the lower extension portion 35a or 35b may be variable. That is, the upper extension portion 37b or 37d surrounding the distal end of the lower extension portion 35a or 35b may have a semicircular shape having a variable radius. Referring to FIG. 1, a diagonal distance d2 between the distal end of the lower extension portion 35a or 35b and the primary upper extension portion 37b or 37d may be greater than a horizontal distance d1 there in between. Here, the horizontal distance d1 means a distance from the distal end of the lower extension portion 35a or 35b to the primary upper extension portion 37b or 37d in a horizontal direction that is parallel to the substrate 21. In addition, the diagonal distance d2 means a distance from the distal end of the lower extension portion 35a or 35b to the primary upper extension portion 37b or 37d in a slanted direction with respect to the horizontal direction. With the structure wherein the diagonal distance d2 is greater than the horizontal distance d1, the primary upper extension portions 37b, 37d may be disposed closer to upper corners of the light emitting cells, respectively. With the structure wherein the primary upper extension portions 37b, 37d are disposed closer to the upper corners of the light emitting cells, the light emitting diode allows efficient current spreading to the upper corners of the light emitting cells.

The secondary upper extension portion 37c disposed on each of the third light emitting cell D1 and the fourth light emitting cell D2 may extend from each of the primary upper extension portion 37d towards each of the lower extension portion 35a on the first or second light emitting cell C1 or C2. The secondary upper extension portion 37c may have a linear shape and may be collinear with the lower extension portion 35a. The secondary upper extension portion 37c is connected at one end thereof to the primary upper extension portion 37d and at the other end thereof to the connecting portion 35c.

Referring to FIG. 1 and FIG. 4, each of the connecting portions 35c connects the secondary upper extension portion 37c to the lower extension portion 35a. That is, the lower extension portion 35a on the first light emitting cell C1 is connected to the secondary upper extension portion 37c on the third light emitting cell D1 through the connecting portion 35c, and the lower extension portion 35a on the second light emitting cell C2 is connected to the secondary upper extension portion 37c on the fourth light emitting cell D2 through another connecting portion 35c. Accordingly, the first light emitting cell C1 may be connected in series to the third light emitting cell D1 and the second light emitting cell C2 may be connected in series to the fourth light emitting cell D2. Meanwhile, the first and third light emitting cells C1, D1 are connected in parallel to the second and fourth light emitting cells C2, D2. The connecting portions 35c are separated from the third and fourth light emitting cells D1, D2 by the insulating layer 32a.

The first electrode pad 37, the second electrode pad 35, the upper extension portions 37a, 37b, 37c, 37d, the lower extension portions 35a, 35b and the connecting portions 35c may be formed together using the same material by the same process, and may have a multilayer structure of, for example, Cr/Al/Cr/Ni/Au. However, it should be understood that other implementations are also possible and these components may be formed of different materials by different processes.

Meanwhile, the upper extension portions 37a, 37b, 37c, 37d, the lower extension portions 35a, 35b and the connecting portions 35c may have symmetrical structures with respect to an imaginary line passing through the first electrode pad 37 and the second electrode pad 35. In addition, the light emitting diode according to this exemplary embodiment may have a symmetrical structure with respect to the imaginary line passing through the first electrode pad 37 and the second electrode pad 35. With this structure, the light emitting diode can achieve uniform current spreading.

Referring again to FIG. 1 to FIG. 4, the current blocking layer 31a may be disposed under the first electrode pad 37 and may be referred to as a third current blocking layer 31a. In addition, the current blocking layer 31d may be disposed under the upper extension portions 37a, 37b, 37c, 37d and may be referred to as a fourth current blocking layer 31d. The fourth current blocking layer 31d is disposed between the transparent electrode layer 33 and the upper semiconductor layer 27 of each of the light emitting cells C1, C2, D1, D2 under each of the upper extension portions 37a, 37b, 37c, 37d. Furthermore, the fourth current blocking layer 31d may be connected to the insulating layer 32a disposed under the connecting portion 35c.

The third and fourth current blocking layers 31a, 31d may be formed of an insulating material and may be composed of a single layer or multiple layers. For example, the third and fourth current blocking layers 31a and 31d may include $SiO_x$ or $SiN_x$, and may include a distributed Bragg reflector (DBR) in which insulating material layers having different indices of refraction are stacked one above another. The fourth current blocking layer 31d prevents current from directly flowing from the upper extension portions 37a, 37b, 37c, 37d to the light emitting cells C1, C2, D1, D2, thereby allowing current spreading over a wide area of the light emitting cells C1, C2, D1, D2. The fourth current blocking layer 31d may have a greater line width than the upper extension portions 37a, 37b, 37c, 37d. If the fourth current blocking layer 31d is too large, the fourth current blocking layer 31d can cause light loss through absorption of light emitted from the light emitting cells, accordingly, preferably, the line width of the fourth current blocking layer 31d is less than three times the line width of the upper extension portions 37a, 37b, 37c, 37d.

In addition, referring to FIG. 3, the third current blocking layer 31a disposed under the first electrode pad 37 to insulate the first electrode pad 37 from the first lower semiconductor layer 23a. Furthermore, the third current blocking layer 31a may also be interposed between the first electrode pad 37 and each of the first and second light emitting cells C1, C2. In this structure, the third current blocking layer 31a may be interposed between the transparent electrode layer 33 and the upper semiconductor layer 27.

FIG. 5 is an enlarged plan view of the first electrode pad 37 of FIG. 1 and FIG. 6 is a cross-sectional view taken along line D-D of FIG. 5.

Referring to FIG. 5 and FIG. 6, the third current blocking layer 31a having a larger area than the first electrode pad 37 is disposed under the first electrode pad 37. The first electrode pad 37 is placed only on the third current blocking layer 31a. The first electrode pad 37 is disposed on the mesa isolation groove 27a to straddle the first light emitting cell C1 and the second light emitting cell C2. In this structure, the third current blocking layer 31a insulates the first electrode pad 37 and the first lower semiconductor layer 23a from each other on the mesa isolation groove 27a. In addition, the third current blocking layer 31a is interposed between the transparent electrode layer 33 and the upper semiconductor layer 27 on each of the first and second light emitting cells C1, C2. A part of the transparent electrode layer 33 is disposed under the first electrode pad 37. Thus, the first electrode pad 37 is electrically connected to the upper semiconductor layer 27 through the transparent electrode layer 33. The transparent electrode layer 33 has an opening 33a which exposes the third current blocking layer 31a. The openings 33a formed in the transparent electrode layer 33 on the first light emitting cell C1 and the second light emitting cell C2 may be symmetrical to each other with respect to the mesa isolation groove 27a.

The opening 33a may have a partial doughnut shape. Specifically, the opening 33a may include a concave sidewall, a convex sidewall, and a flat sidewall connecting the concave sidewall to the convex sidewall. With the structure wherein the opening 33a is formed in the transparent electrode layer 33, adhesion of the first electrode pad 37 can be improved. Although the opening 33a is formed in the transparent electrode layer 33 in this exemplary embodiment, the opening 33a may be formed in the third current blocking layer 31a so as to expose the upper semiconductor layer 27.

FIG. 7 is an enlarged plan view of the second electrode pad 35 of FIG. 1 and FIG. 8 is a cross-sectional view taken along line E-E of FIG. 7.

Referring to FIG. 7 and FIG. 8, the second electrode pad 35 is disposed in the mesa isolation groove 27a to be electrically connected to the second lower semiconductor layer 23b, as described above. The third light emitting cell D1 and the fourth light emitting cell D2 are disposed near the second electrode pad 35.

The insulating layer 32b covers side surfaces of the third light emitting cell D1 and the fourth light emitting cell D2. As shown in FIG. 7 and FIG. 8, the insulating layer 32b covers the side surfaces of the third and fourth light emitting cells D1, D2 excluding a portion thereof through which the lower extension portion 35b passes. The insulating layer 32b can prevent a bonding material from contacting the upper semiconductor layer 27 of the third light emitting cell D1 or the fourth light emitting cell D2 and causing short circuit upon bonding of a wire to the second electrode pad 35.

The insulating layer 32b may be separated from the transparent electrode layer 33 and thus may be formed to have a relatively very small area. As a result, it is possible to reduce light loss caused by the insulating layer 32b.

The light emitting diode according to the exemplary embodiment can be operated at a relatively high voltage using the light emitting cells connected to each other in series. As a result, the light emitting diode according to the exemplary embodiment can reduce overall driving current. Furthermore, the light emitting diode according to the exemplary embodiment can achieve uniform current spreading using the light emitting cells connected to each other in parallel, and the lower extension portions and the upper extension portions. Furthermore, the light emitting diode according to the exemplary embodiment can be packaged by a typical packaging process, and a wavelength conversion layer containing phosphors may be disposed on the light emitting diode. As a result it is possible to provide a light emitting device that emits white light.

Figure 9:
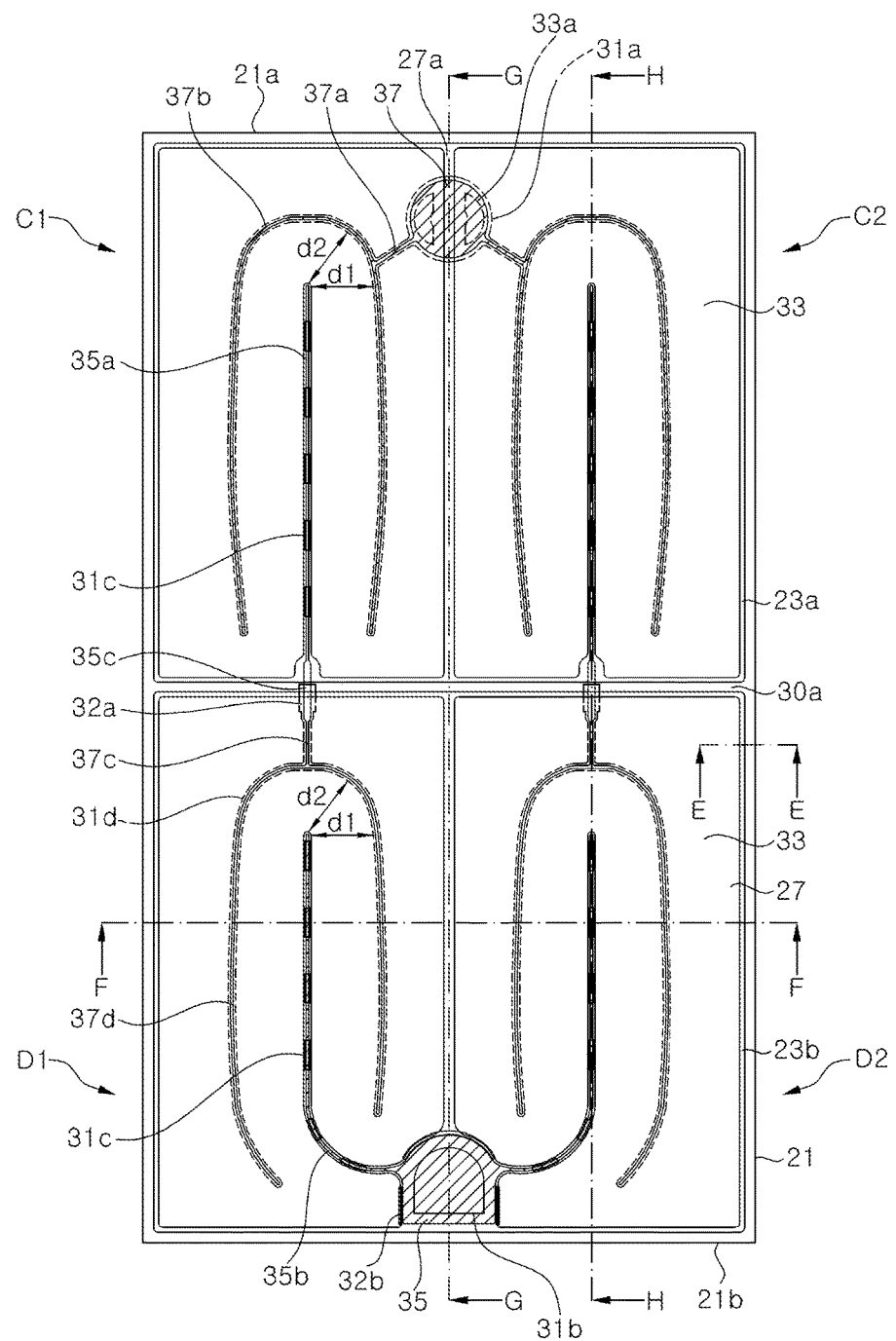
FIG. 9 is a plan view of a light emitting diode according to another exemplary embodiment of the present disclosure.
Figure 10:
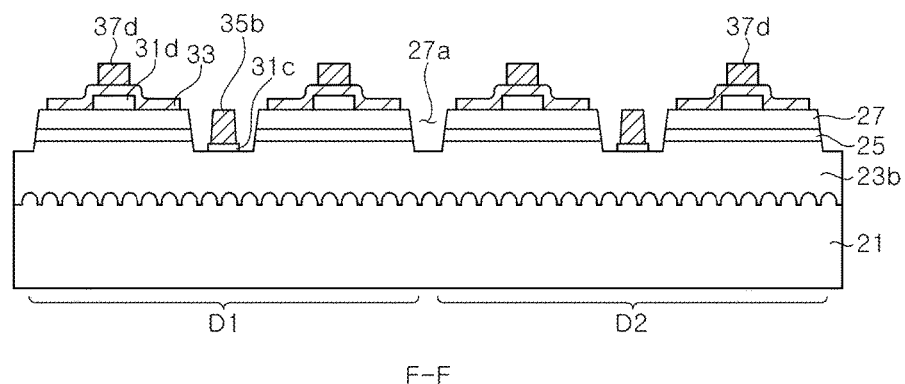
FIG. 10 is a cross-sectional view taken along line F-F of FIG. 9.
Figure 11:
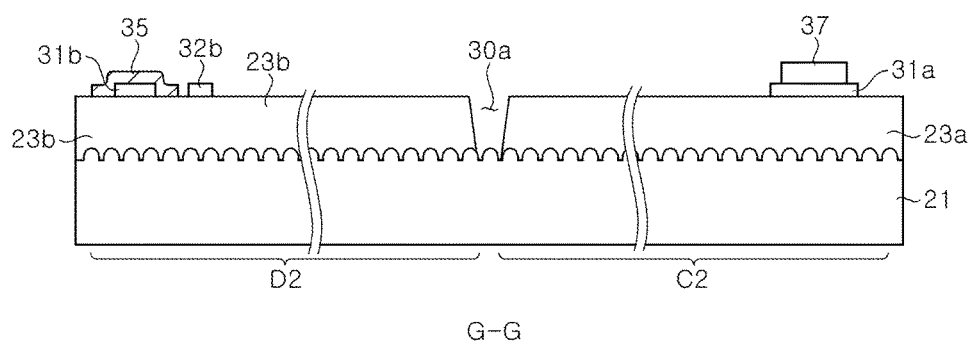
FIG. 11 is a cross-sectional view taken along line G-G of FIG. 9.
Figure 12:
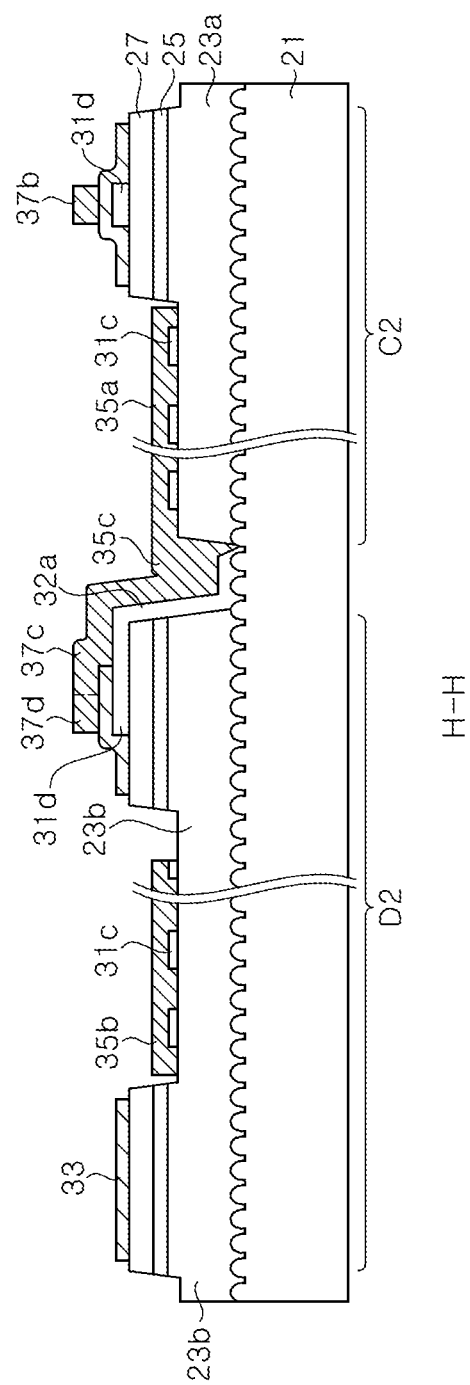
FIG. 12 is a cross-sectional view taken along line H-H of FIG. 9.
Figure 13A:
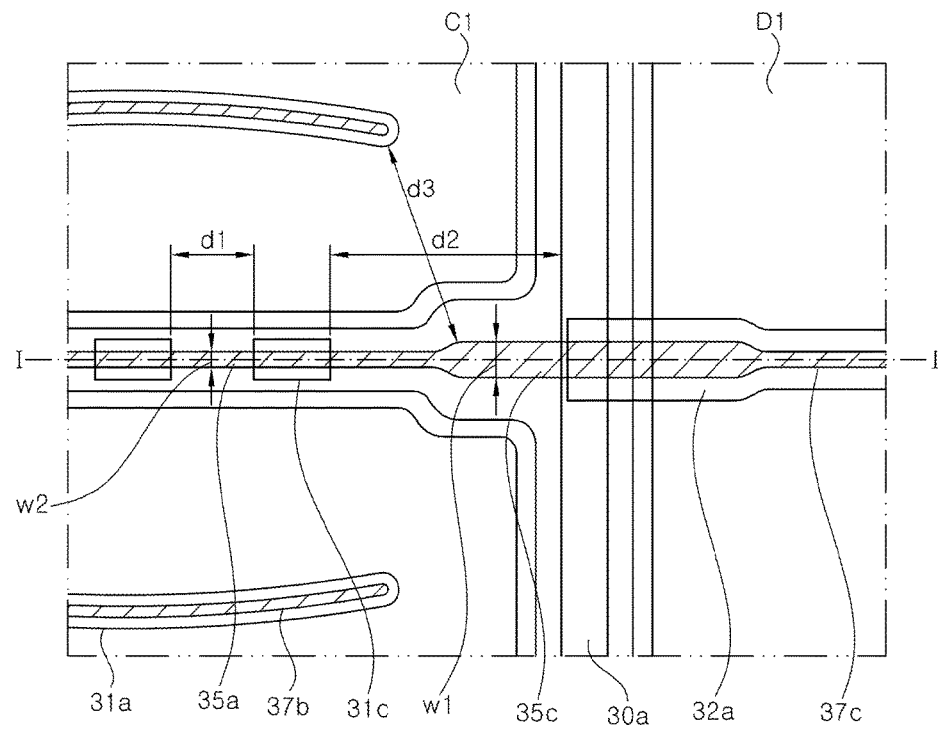
FIG. 13A is an enlarged plan view of one exemplary embodiment of a connecting portion of FIG. 9
Figure 13B:
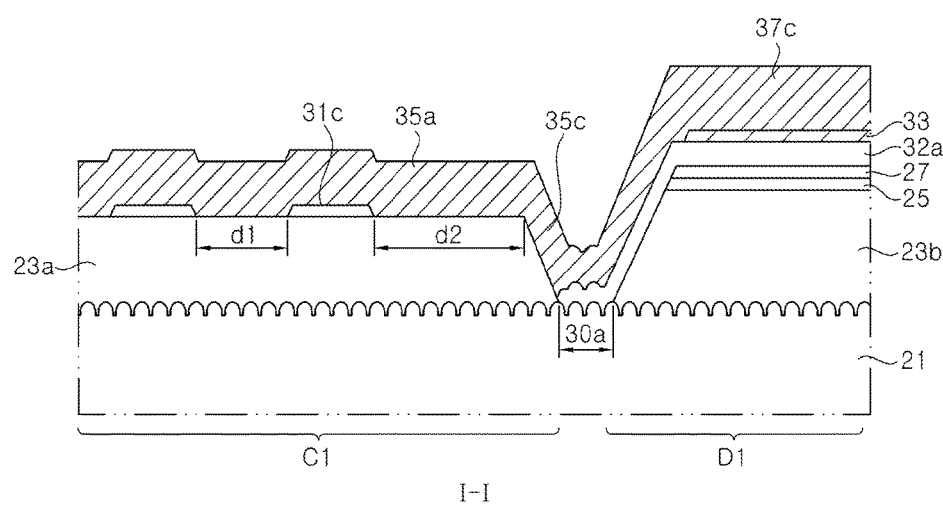
FIG. 13B is a cross-sectional view taken along line I-I of FIG. 13A.
Figure 14A:
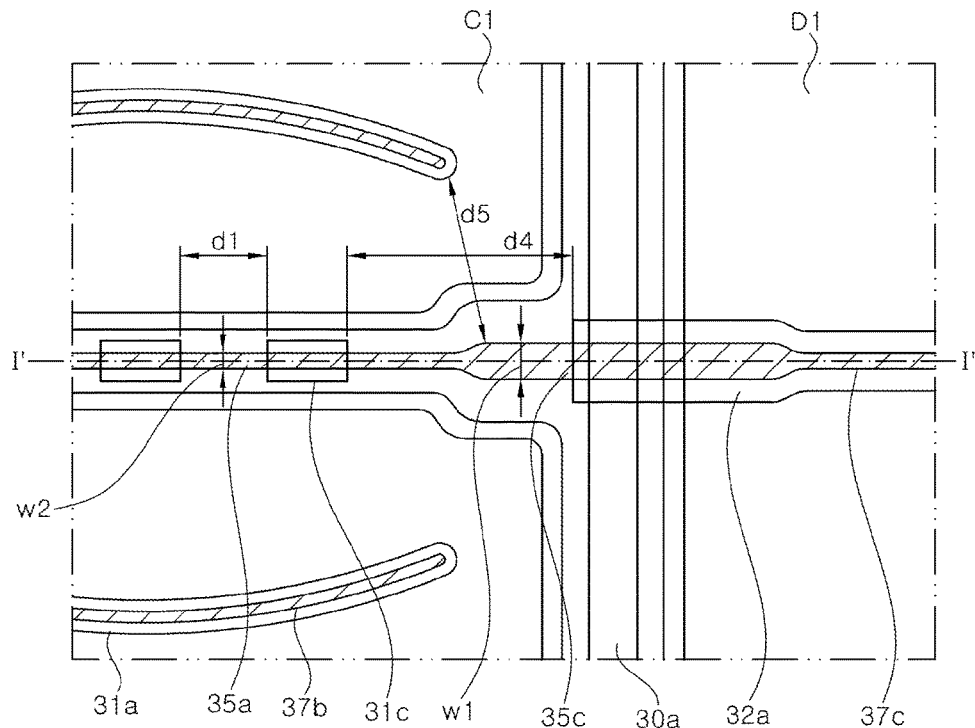
FIG. 14A is an enlarged plan view of another exemplary embodiment of the connecting portion of FIG. 9
Figure 14B:
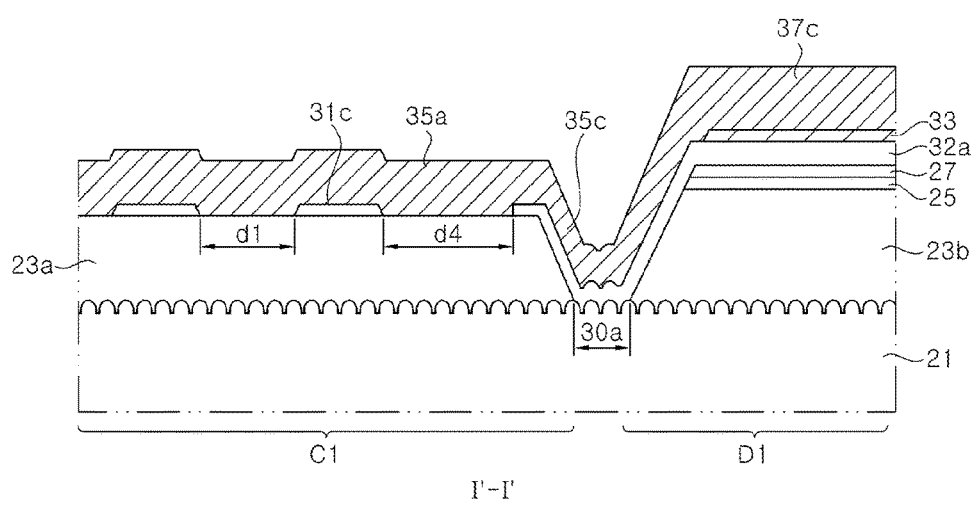
FIG. 14B is a cross-sectional view taken along line I'-I' of FIG. 14A.

FIG. 9 is a plan view of a light emitting diode according to another exemplary embodiment of the present disclosure, FIG. 10 is a cross-sectional view taken along line F-F of FIG. 9, FIG. 11 is a cross-sectional view taken along line G-G of FIG. 9, and FIG. 12 is a cross-sectional view taken along line H-H of FIG. 9. FIG. 13A is an enlarged plan view of one exemplary embodiment of a connecting portion of FIG. 9 and FIG. 13B is a cross-sectional view taken along line I-I of FIG. 13A. FIG. 14A is an enlarged plan view of another exemplary embodiment of the connecting portion of FIG. 9 and FIG. 14B is a cross-sectional view taken along line I'-I' of FIG. 14A. The light emitting diode according to this exemplary embodiment is substantially the same as the light emitting diode shown in FIG. 1 to FIG. 8 and further includes a first current blocking layer 31c disposed under each of the lower extension portions 35a, 35b and a second current blocking layer 31b disposed under the second electrode pad 35. Hereinafter, the following description will focus on different features of the light emitting diode according to this exemplary embodiment and detailed descriptions of the same components will be omitted.

Referring to FIG. 9, FIG. 10 and FIG. 12, the first current blocking layer 31c may be disposed under each of the lower extension portions 35a, 35b. As shown therein, the first current blocking layer 31c disposed under each of the lower extension portions 35a, 35b may include a plurality of dots separated from one another instead of having a single continuous line shape. That is, as shown in FIG. 9, the first current blocking layer 31c may include a plurality of dots separated from one another. Each of the dots is disposed between the lower extension portion 35a or 35b and the lower semiconductor layer 23a or 23b. In this exemplary embodiment, the first current blocking layer 31c, that is, each of the dots, has a greater width than the lower extension portions 35a, 35b. Accordingly, the lower extension portion 35a or 35b does not directly contact the lower semiconductor layer 23a or 23b in regions between which the first current blocking layer 31c is interposed, and contacts the lower semiconductor layer 23a or 23b in a region between the dots. In addition, the dots may be arranged at regular intervals or at different intervals.

The first current blocking layer 31c may be disposed between the lower extension portion 35a or 35b and the lower semiconductor layer 23a or 23b to assist in horizontal current spreading by preventing electric current crowding near the lower extension portions 35a, 35b. With the structure wherein electric current broadly spreads in the horizontal direction in a semiconductor stack, the light emitting diode can have improved luminous efficacy. Particularly, the first current blocking layer 31c may be formed to have a greater line width than the lower extension portions 35a, 35b such that the lower extension portion 35a or 35b can be prevented from directly contacting the lower semiconductor layer 23a or 23b in the regions between which the first current blocking layer 31c is interposed. In this exemplary embodiment, the first current blocking layer 31c is formed to have a greater line width than the lower extension portions 35a, 35b and includes the plurality of dots, thereby further improving current spreading, as compared with the structure wherein the first current blocking layer 31c has a smaller line width than the lower extension portions 35a, 35b.

In this exemplary embodiment, the first current blocking layer 31c is not disposed at a distal end of each of the lower extension portions 35a, 35b. That is, the distal end of each of the lower extension portions 35a, 35b may be directly connected to the lower semiconductor layer 23a or 23b. As used herein, direct connection means that each of the lower extension portions 35a, 35b is connected at the distal end thereof to the lower semiconductor layer 23a or 23b without a material (for example, current blocking layer) interposed there in between. Referring to FIG. 9, each of the upper extension portions 37b, 37d has a structure surrounding the distal end of the lower extension portion 35a or 35b. If the first current blocking layer 31c is disposed at the distal end of each of the lower extension portions 35a, 35b, the lower extension portion 35a or 35b cannot be directly electrically connected at the distal end thereof to the lower semiconductor layer 23a or 23b, thereby causing inefficient current spreading near the distal end of each of the lower extension portions 35a, 35b.

For the first current blocking layer 31c, the number of dots may be determined in various ways depending upon relative lengths of the lower extension portions 35a, 35b. For example, referring to FIG. 9, the first current blocking layers 31c includes five dots separated from one another between the lower extension portion 35a and the first lower semiconductor layer 23a. In addition, the first current blocking layer 31c includes six dots separated from one another between the lower extension portion 35b and the second lower semiconductor layer 23b. This is because the lower extension portion 35b on each of the third and fourth light emitting cells D1, D2 includes a curved region to be connected to the second electrode pad 35 and thus has a greater length than the lower extension portion 35b on each of the first and second light emitting cells C1, C2. For the first current blocking layer 31c, the distances between the plural dots may be the same or different. It should be understood that the number of dots for the first current blocking layer 31c is given by way of exemplary illustration only in FIG. 9 and does not limit other exemplary embodiments of the present disclosure.

Further, the second current blocking layer 31b may be disposed under the second electrode pad 35. The second current blocking layer 31b is disposed between the second electrode pad 35 and the second lower semiconductor layer 23b to allow efficient horizontal spreading of electric current injected into the second lower semiconductor layer 23b. The second current blocking layer 31b may have a smaller area than the second electrode pad 35. That is, the second current blocking layer 31b may have smaller widths in the horizontal and vertical directions thereof than the second electrode pad 35 and thus may be restrictively disposed under some region of the second electrode pad 35. For example, the area of the second current blocking layer 31b may be restricted to 90% or less the area of the second electrode pad 35. If the area of the second current blocking layer 31b exceeds 90% the area of the second electrode pad 35, there is a problem of increase in forward voltage Vf. Thus, with the structure wherein the area of the second current blocking layer 31b is set to be 90% or less compare to the area of the second electrode pad 35, the light emitting diode can achieve high luminous efficacy without increase in forward voltage. As in the third and fourth current blocking layers 31a and 31d, the first and second current blocking layer 31c, 31b may be formed of an insulating material and may be composed of a single layer or multiple layers. For example, the second current blocking layer 31b may include $SiO_x$ or $SiN_x$, and may include a distributed Bragg reflector (DBR) in which insulating material layers having different indices of refraction are stacked one above another.

FIG. 13A is an enlarged plan view of one exemplary embodiment of a connecting portion of FIG. 9 and FIG. 13B is a cross-sectional view taken along line I-I of FIG. 13A.

The connecting portion 35c electrically connects two light emitting cells C1, D1 that are isolated from each other by the isolation groove 30a, and is connected at one end thereof to the lower extension portion 35a on the first light emitting cell C1 and at the other end thereof to the secondary upper extension portion 37c on the third light emitting cell D1. Referring to FIG. 13A, a width w1 of the connecting portion 35c may be greater than a width w2 of the lower extension portion 35a. In addition, the first current blocking layer 31c may not be disposed under the connecting portion 35c and the portion of the lower extension portion 35a that is connected to connecting portion 35c on the first light emitting cell C1, so that the connecting portion 35c and the portion of the lower extension portion 35a that is connected to the connecting portion 35c may directly contact the lower semiconductor layer 23a. As such, with the structure wherein the connecting portion 35c having a relatively large width w1 and the portion of the lower extension portion 35a that is connected to the connecting portion 35c directly contact the lower semiconductor layer 23a, the light emitting diode allows efficient horizontal current spreading along an outer periphery of the first light emitting cell C1, in which the primary upper extension portion 37b is not formed. In addition, the connecting portion 35c is formed to have a relatively large width w1 to reduce a risk of disconnection of the connecting portion 35c, thereby improving reliability of the light emitting diode.

Referring to FIG. 13A and FIG. 13B, the first current blocking layer 31c may be disposed in the form of plural dots between the lower extension portion 35a and the lower semiconductor layer 23a. The first current blocking layer 31c may have a greater width than the lower extension portion 35a, whereby the lower extension portion 35a can directly contact the lower semiconductor layer 23a only between the dots of the first current blocking layer 31c. That is, a contact distance between the lower extension portion 35a and the lower semiconductor layer 23a may be determined depending upon a separation distance d1 between the dots.

Between the first current blocking layer 31c and the isolation groove 30a, that is, between the last dot of the first current blocking layer 31c and the isolation groove 30a, a contact distance d2 may be greater than the separation distance d1 between the dots of the first current blocking layer 31c. That is, between the last dot of the first current blocking layer 31c and the isolation groove 30a, a contact area in which the connecting portion 35c and the lower extension portion 35a that is connected to the connecting portion 35c contact the lower semiconductor layer 23a may be larger than a contact area in which the lower extension portion 35a contacts the lower semiconductor layer 23a between the respective dots, thereby reducing resistance. With this structure, the light emitting diode can achieve efficient current spreading to the outer periphery of the first light emitting cell C1, C2. That is, the upper extension portion 37b may not be formed at the outer periphery of the first and second light emitting cell C1, C2, thereby providing a relatively large distance d3 between the distal end of upper extension portion 37b and the connecting portion 35c. In this structure, electric current often fails to reach of the outer periphery of the first light emitting cell C1, C2. Thus, the contact area, between the last dot of the first current blocking layer 31c and the isolation groove 30a, in which the connecting portion 35c and the lower extension portion 35a that is connected to the connecting portion 35c contact the lower semiconductor layer 23a can be increased by increasing the separation distance d2 to reduce resistance, thereby allowing efficient dispersion of electric current to the outer periphery of the first light emitting cell C1.

Referring to FIG. 13B, the insulating layer 32a disposed under the connecting portion 35c may extend from a portion of the side surface of the lower semiconductor layer 23a of the first light emitting cell C1 to side surfaces of the lower semiconductor layer 23b, the active layer 25 and the upper semiconductor layer 27 of the third light emitting cell D1 and to an upper surface of the upper semiconductor layer 27 thereof.

FIG. 14A is an enlarged plan view of another exemplary embodiment of the connecting portion 35c of FIG. 9 and FIG. 14B is a cross-sectional view taken along line I'-I' of FIG. 14A. The connecting portion 35c shown in FIG. 14A and FIG. 14B is substantially the same as the connecting portion shown in FIG. 13A and FIG. 13B except for the shapes of the insulating layer 32a and the upper extension portion 37b. As a result, a contact area between the connecting portion 35c and the lower semiconductor layer 23a can be changed. The following description will focus on different features of the connecting portion according to this exemplary embodiment and descriptions of the same components will be omitted.

Referring to FIG. 14A and FIG. 14B, the insulating layer 32a further extends towards the first light emitting cell C1 to cover the side surface and a portion of an upper surface of the lower semiconductor layer 23a of the first light emitting cell C1, as compared with the exemplary embodiment of FIG. 13A and FIG. 13B. In this structure, between the first current blocking layer 31c and the isolation groove 30a, a contact distance d4 of the lower extension portion 35a and the connecting portion 35c between the last dot of the first current blocking layer 31c and end of the insulating layer 32a which is on the first light emitting cell C1 can be reduced, as compared with the exemplary embodiment of FIG. 13. That is, as compared with the exemplary embodiment of FIG. 13A and FIG. 13B, between the first current blocking layer 31c and the isolation groove 30a, the contact area, between the last dot of the first current blocking layer 31c and end of the insulating layer 32a which is on the first light emitting cell C1, on which the connecting portion 35c and the lower extension portion 35a that is connected to the connecting portion 35c contact the lower semiconductor layer 23a can be reduced, thereby increasing current density. In this exemplary embodiment, the contact distance d4 may still be longer than the separation distance d1 between the dots of the first current blocking layer 31c. Alternatively, the contact distance d4 may be shorter than the separation distance d1 between the dots of the first current blocking layer 31c.

Referring to FIG. 14A, a distance d5 from the distal end of the upper extension portion 37b to the connecting portion 35c can be reduced, as compared with the exemplary embodiment of FIG. 13A. That is, the upper extension portion 37b further extends towards the connecting portion 35c such that the distance d5 between the distal end of the upper extension portion 37b and the connecting portion 35c can be reduced, as compared with the exemplary embodiment of FIG. 13A. In the exemplary embodiment of FIG. 14A and FIG. 14B, between the first current blocking layer 31c and the isolation groove 30a, the distance d5 between the distal end of the upper extension portion 37b and the connecting portion 35c having a relatively large width w1 is reduced corresponding to reduction in contact area in which the connecting portion 35c and the lower extension portion 35a connected to the connecting portion 35c contact the lower semiconductor layer 23a, in order to achieve efficient horizontal current spreading to the outer periphery of the first light emitting cell C1.

Figure 15:
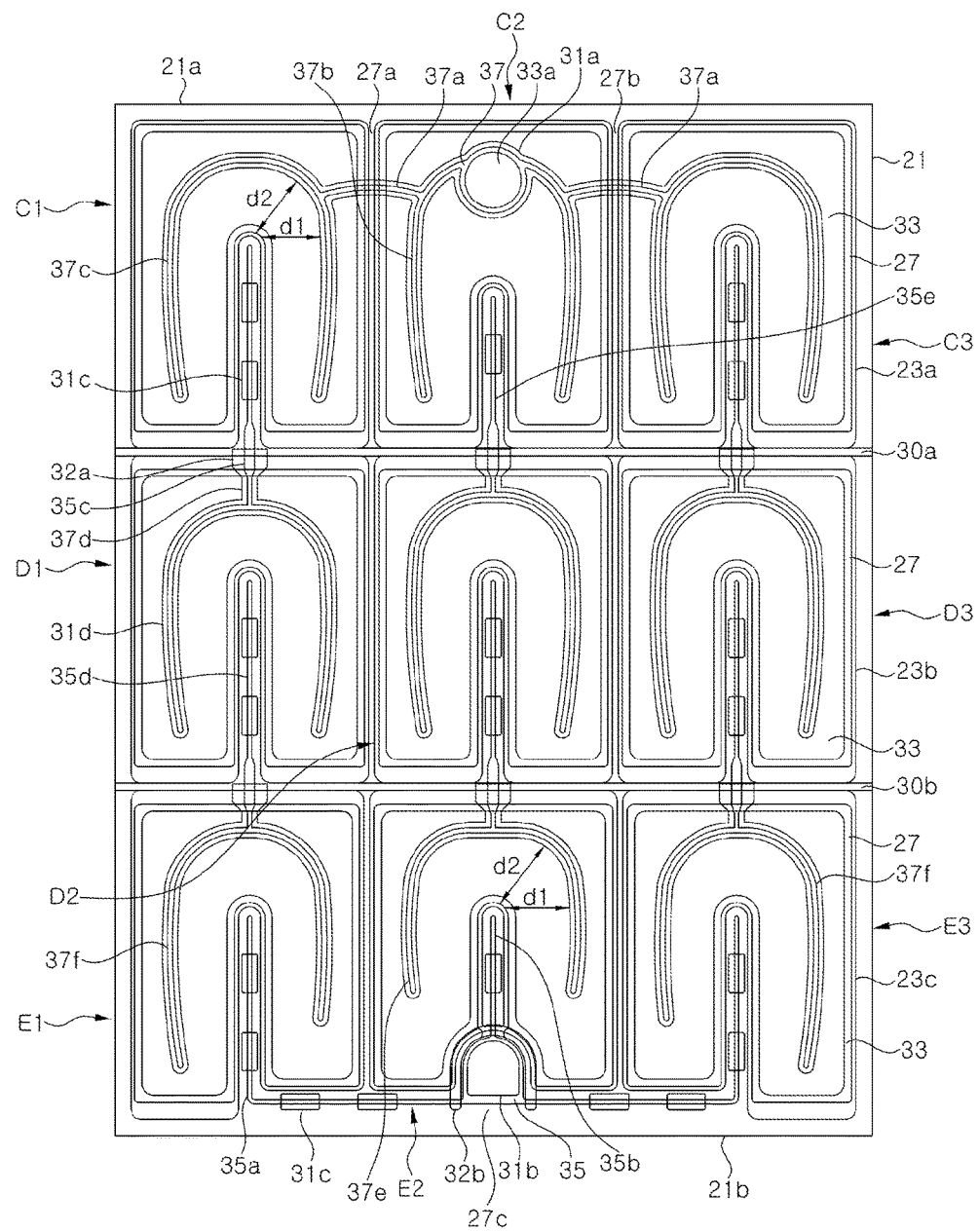
FIG. 15, FIG. 16, and FIG. 17 are plan views of light emitting diodes according to other exemplary embodiments of the present disclosure.
Figure 16:
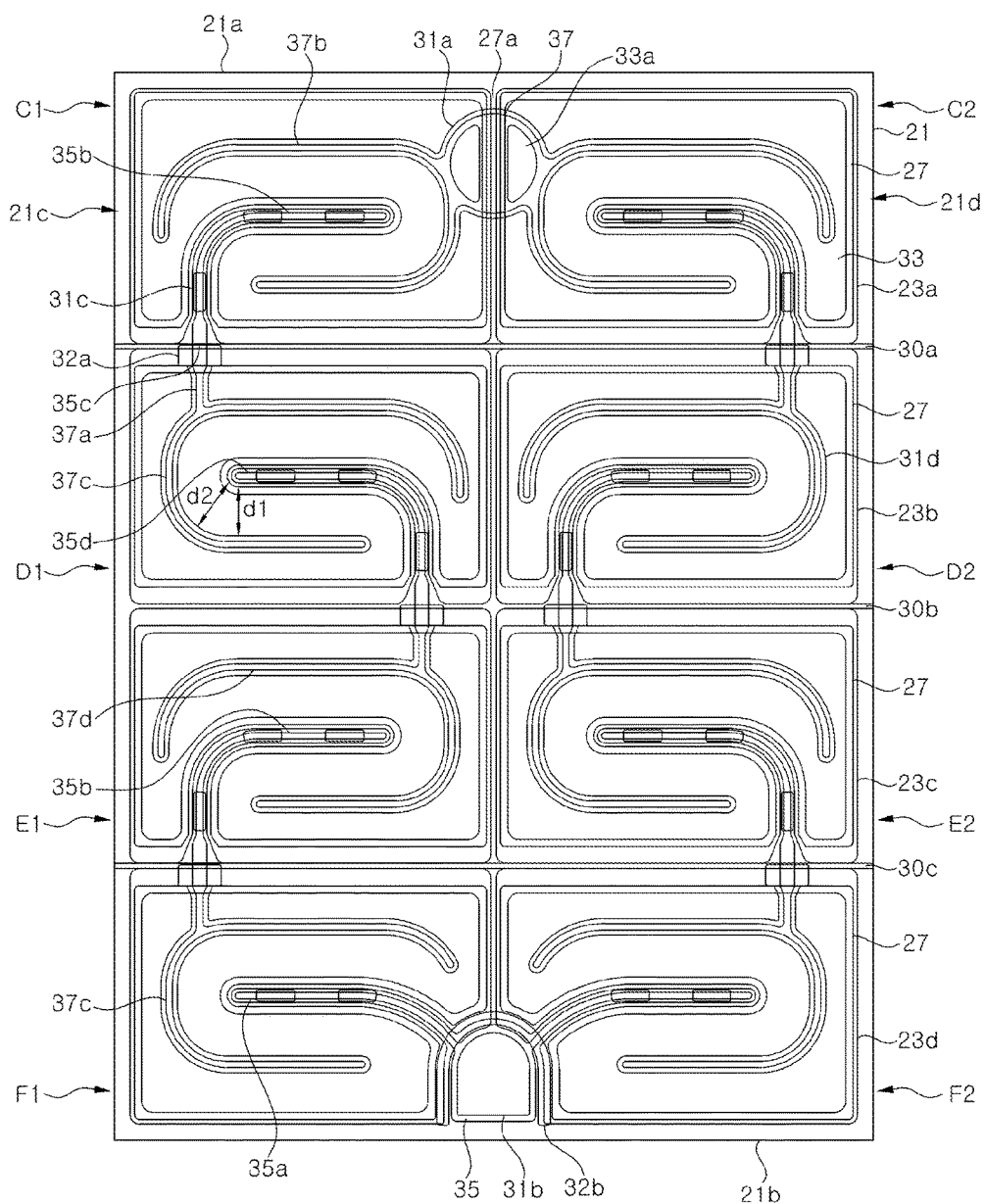
Figure 17:
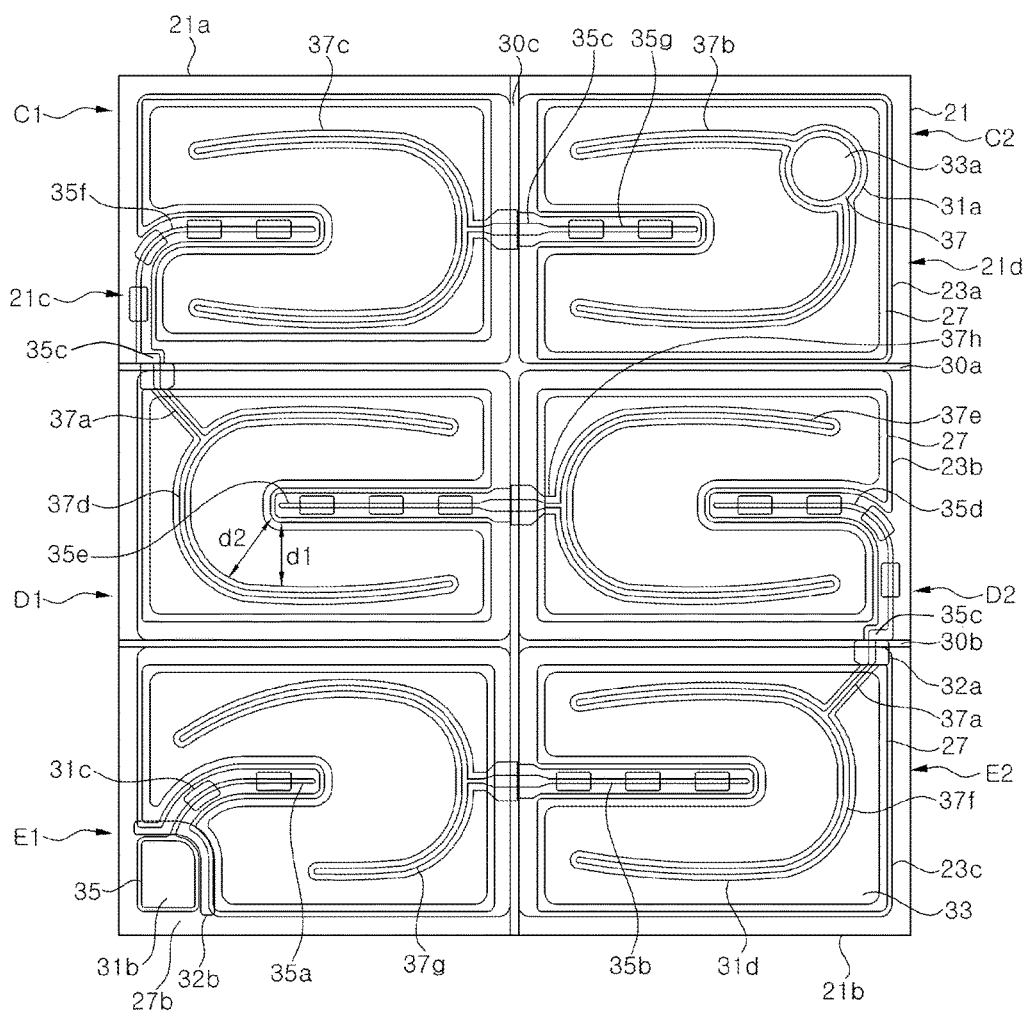

FIG. 15 to FIG. 17 are plan views of light emitting diodes according to other exemplary embodiments of the present disclosure. The light emitting diode shown in FIG. 15 to FIG. 17 is similar to the light emitting diode shown in FIG. 9 excluding structures of a first electrode pad 37, a second electrode pad 35, upper extension portions and lower extension portions, and the number of light emitting cells. Thus, the following description will focus on different features of this exemplary embodiment and descriptions of the same components will be omitted.

FIG. 15 is a plan view of a light emitting diode according to a further exemplary embodiment of the present disclosure.

Referring to FIG. 15, the light emitting diode according to this exemplary embodiment includes first to third light emitting cells C1, C2, C3, fourth to sixth light emitting cells D1, D2, D3, and seventh to ninth light emitting cells E1, E2, E3 disposed on a substrate 21. The light emitting diode further includes a first electrode pad 37, a second electrode pad 35, upper extension portions 37a, 37b, 37c, 37d, 37e, 37f, and lower extension portions 35a, 35b, 35d, 35e.

The first to third light emitting cells C1, C2, C3 may be isolated from the fourth to sixth light emitting cells D1, D2, D3 by an isolation groove 30a, respectively. In addition, the fourth to sixth light emitting cells D1, D2, D3 are isolated from the seventh to ninth light emitting cells E1, E2, E3 by an isolation groove 30b, respectively. That is, a first lower semiconductor layer 23a may be isolated from a second lower semiconductor layer 23b by the isolation groove 30a, and the second lower semiconductor layer 23b may be isolated from a third lower semiconductor layer 23c by the isolation groove 30b. Accordingly, the first light emitting cell C1, the second light emitting cell C2 and the third light emitting cell C3 may share the first lower semiconductor layer 23a, and the fourth light emitting cell D1, the fifth light emitting cell D2 and the sixth light emitting cell D3 may share the second lower semiconductor layer 23b. In addition, the seventh light emitting cell E1, the eighth light emitting cell E2 and the ninth light emitting cell E3 may share the third lower semiconductor layer 23c. The isolation grooves 30a, 30b may be formed by an isolation process and the substrate 21 may be exposed through the isolation grooves 30a, 30b. The first light emitting cell C1, the fourth light emitting cell D1, and the seventh light emitting cell E1 may be isolated from the second light emitting cell C2, the fifth light emitting cell D2, and the eighth light emitting cell E2, respectively, by a mesa etching process in which a mesa isolation groove 27a is formed to expose the lower semiconductor layers 23a, 23b, 23c. In addition, the second light emitting cell C2, the fifth light emitting cell D2, and the eighth light emitting cell E2 may be isolated from the third light emitting cell C3, the sixth light emitting cell D3, and the ninth light emitting cell E3, respectively, by a mesa etching process in which a mesa isolation groove 27b is formed to expose the lower semiconductor layers 23a, 23b, 23c. That is, the semiconductor stack including the lower semiconductor layers 23a, 23b, 23c, an active layer 25 and an upper semiconductor layer 27 are divided into the first to ninth light emitting cells C1, C2, C3, D1, D2, D3, E1, E2, E3 by the mesa isolation grooves 27a, 27b and the isolation grooves 30a, 30b.

The first light emitting cell C1 may be symmetrical to the third light emitting cell C3 with respect to an imaginary line connecting the first electrode pad 37 to the second electrode pad 35. The fourth to sixth light emitting cells D1, D2, D3 may have the same shape. The fourth to sixth light emitting cells D1, D2, D3 may have the same shape as the first light emitting cell C1 excluding a secondary upper extension portion 37a. In addition, the seventh light emitting cell E1 may be symmetrical to the ninth light emitting cell E3 with respect to an imaginary line connecting the first electrode pad 37 to the second electrode pad 35.

In this exemplary embodiment, the second light emitting cell C2 on which the first electrode pad 37 is formed and the eighth light emitting cell E2 on which the second electrode pad 35 is formed have significantly different shapes than other light emitting cells. The first electrode pad 37 may be disposed near one edge 21a of the substrate 21 and the second electrode pad 35 may be disposed near the other edge 21b of the substrate 21 facing the one edge 21a thereof. As shown in FIG. 15, the first electrode pad 37 and the second electrode pad 35 may be disposed to face each other.

The first electrode pad 37 may be formed on the second light emitting cell C2. A third current blocking layer 31a may be disposed under the first electrode pad 37. Specifically, the third current blocking layer 31a may be interposed between the transparent electrode layer 33 and the upper semiconductor layer 27 under the first electrode pad 37. The third current blocking layer 31a may have a greater width than the first electrode pad 37, whereby the third current blocking layer 31a can insulate the first electrode pad 37 from the first lower semiconductor layer 23a. A part of the transparent electrode layer 33 may be disposed under the first electrode pad 37. The transparent electrode layer 33 may include an opening 33a which exposes the third current blocking layer 31a. The opening 33a may have a circular shape. With the structure wherein the opening 33a is formed in the transparent electrode layer 33, adhesion of the first electrode pad 37 can be improved. However, it should be understood that the opening 33a is not limited to the circular shape and may have a variety of shapes so long as the opening can improve adhesion of the first electrode pad 37.

The second electrode pad 35 may be disposed on a mesa groove 27c. That is, for formation of the second electrode pad 35, a lower end of the eighth light emitting cell E2 near the other edge 21b of the substrate 21 is partially removed by mesa etching to form the mesa groove 27c. The second electrode pad 35 may be disposed in the mesa groove 27c to be electrically connected to the third lower semiconductor layer 23c.

A second current blocking layer 31b may be disposed under the second electrode pad 35. The second current blocking layer 31b is disposed between the second electrode pad 35 and the third lower semiconductor layer 23c to allow efficient horizontal spreading of electric current injected into the third lower semiconductor layer 23c. The second current blocking layer 31b may have a smaller area than the second electrode pad 35. That is, the second current blocking layer 31b may have smaller widths in the horizontal and vertical directions thereof than the second electrode pad 35 and thus may be restrictively disposed under some region of the second electrode pad 35. For example, the area of the second current blocking layer 31b may be restricted to 90% or less the area of the second electrode pad 35.

The insulating layer 32b covers a side surface of the mesa groove 27c on which the second electrode pad 35 is disposed. As shown in FIG. 15, the insulating layer 32b may also be formed at a portion through which the lower extension portion 35b passes while covering the side surface of the mesa groove 27c to form an entirely closed curve. The insulating layer 32b may be first formed at the portion through which the lower extension portion 35b passes, and then the lower extension portion 35b may be formed thereon. Accordingly, the lower extension portion 35b may have a higher height at a portion thereof, on which the insulating layer 32b is formed, than at other portions thereof. The insulating layer 32b can prevent a bonding material from contacting the upper semiconductor layer 27 of the eighth light emitting cell E2 and causing short circuit upon bonding of a wire to the second electrode pad 35.

The lower extension portions 35d disposed on the first, third, fourth, fifth, and sixth light emitting cells C1, C3, D1, D2, D3 may include linear regions (in the vertical direction) and may be parallel to one another. Each of the lower extension portions 35d may be connected at one end thereof to the connecting portion 35c and may have the other end separated from a primary upper extension portion 37c and surrounded thereby. The lower extension portion 35e is formed on the second light emitting cell C2, includes a linear region, and may have a shorter length than the lower extension portions 35d due to the first electrode pad 37. As a result, the light emitting diode according to this exemplary embodiment may have a smaller number of first current blocking layers 31c than the light emitting diode according to the above exemplary embodiment. The lower extension portion 35e formed on the second light emitting cell C2 and the lower extension portion 35b formed on the eighth light emitting cell E2 may be placed on an imaginary line connecting the first electrode pad 37 to the second electrode pad 35.

The lower extension portion 35a (on both the seventh and ninth light emitting cells E1 and E3) is connected to the second electrode pad 35 and includes two linear regions connected to each other. The two linear regions may be parallel to the horizontal and vertical directions of the substrate 21, respectively, and may be orthogonal to each other. The linear region in the horizontal direction connects the linear region in the vertical direction to the second electrode pad 35. As shown in FIG. 15, in order to form the lower extension portion 35a (particularly, the linear region in the horizontal direction), some regions of the seventh to ninth light emitting cells E1, E2, E3 near the other edge 21b of the substrate 21 may be removed by mesa etching.

The lower extension portion 35b may be formed on the eighth light emitting cell E2. The lower extension portion 35b may be connected at one end thereof to the second electrode pad 35 and may have the other end surrounded by a primary upper extension portion 37e. The lower extension portion 35b may have a shorter length than the other lower extension portions 35a, 35d due to the second electrode pad 35, whereby the light emitting diode according to this exemplary embodiment may have a smaller number of first current blocking layers 31c than the light emitting diode according to the above exemplary embodiment.

The lower extension portions 35a, 35b, 35d, 35e may be parallel to one another and may pass through the centers of the corresponding light emitting cells. The first current blocking layers 31c may be disposed under each of the lower extension portions 35a, 35b, 35d, 35e. The primary upper extension portions 37b, 37c, 37e, 37f have a structure surrounding the distal ends of the lower extension portions 35e, 35d, 35b, 35a, respectively. Accordingly, for the same reason as described in the exemplary embodiment of FIG. 1, the first current blocking layer 31c may not be disposed at the distal end of each of the lower extension portions 35a, 35b, 35d, 35e.

Meanwhile, the upper extension portions 37a, 37b, 37c, 37d, 37e, 37f may be disposed on the transparent electrode layer 33. The secondary upper extension portion 37a may electrically connect the primary upper extension portions 37b, 37c to each other on the first to third light emitting cells C1, C2, C3. Specifically, the secondary upper extension portion 37a may electrically connect the primary upper extension portions 37b, 37c of two light emitting cells adjacent to each other at the right and left sides of the secondary upper extension portion 37a. The secondary upper extension portion 37a may be formed to straddle the two light emitting cells adjacent to each other in the horizontal direction and may have a curved shape. For example, referring to FIG. 15, the secondary upper extension portion 37a may connect the primary upper extension portion 37c on the first light emitting cell C1 to the primary upper extension portion 37b on the second light emitting cell C2. As a result, the first light emitting cell C1 may be electrically connected in parallel to the second light emitting cell C2.

Secondary upper extension portions 37d may connect the primary upper extension portions 37c (on the fourth to sixth light emitting cells D1, D2, D3), 37e, 37f on the fourth to ninth light emitting cells D1, D2, D3, E1, E2, E3 to the lower extension portions 35d, 35e. The secondary upper extension portion 37d may have a linear shape and may be coaxial with the lower extension portion 35d or 35e. Each of the secondary upper extension portions 37d may be connected at one end thereof to the primary upper extension portion 37c, 37e or 37f and at the other end thereof to the connecting portion 35c.

The primary upper extension portions 37b may extend from the first electrode pad 37 on the second light emitting cell C2. Specifically, the primary upper extension portions 37b may extend from one edge 21a of the substrate towards the other edge 21b thereof at which the second electrode pad 35 is disposed. Referring to FIG. 15, two primary upper extension portions 37b may be formed symmetrical to each other with respect to an imaginary line connecting the first electrode pad 37 to the second electrode pad 35. The primary upper extension portions 37b may have a curved shape, and thus, the primary upper extension portions 37b are connected to the first electrode pad 37 so as to surround a distal end of the lower extension portion 35e and a portion of the side surface thereof.

The primary upper extension portion 37c may be disposed on each of the first, third, fourth, fifth and sixth light emitting cells C1, C3, D1, D2, D3 to surround a distal end of the lower extension portion 35d and a portion of the side surface thereof. Accordingly, a portion of the primary upper extension portion 37c may be disposed at one side of the lower extension portion 35d and another portion of the primary upper extension portion 37c may be disposed at the other side thereof facing the one side of the lower extension portion 35d. The primary upper extension portion 37c may have a symmetrical structure with respect to an imaginary line extending from the lower extension portion 35d.

The primary upper extension portion 37f may be disposed on each of the seventh light emitting cell E1 and the ninth light emitting cell E3 to surround a distal end of the lower extension portion 35a and a portion of the side surface thereof. As described above, the lower extension portion 35a has a shape in which two linear regions in the horizontal and vertical directions are coupled to each other, and each of the primary upper extension portions 37f may be disposed to surround a distal end of the linear region of the lower extension portion 35a in the vertical direction and a portion of the side surface thereof. A portion of the primary upper extension portion 37f may be disposed outside the lower extension portion 35a and another portion of the primary upper extension portion 37f may be disposed inside the lower extension portion 35a. Herein, the outside means a portion farther apart from the second electrode pad 35 with reference to the lower extension portion 35a, and the inside means a portion disposed to face the outside and placed closer to the second electrode pad 35. As shown in FIG. 15, a portion of the primary upper extension portion 37*f* disposed inside the lower extension portion 35*a* may have a shorter distance than a portion of the primary upper extension portion 37*f* disposed outside the lower extension portion 35*a*. In this structure, a distal end of the primary upper extension portion 37*f* disposed inside the lower extension portion 35*a* is separated a predetermined distance from a portion of the lower extension portion 35*a* disposed therebelow, thereby preventing current crowding at the lower extension portion 35*a*.

The primary upper extension portion 37*e* may be disposed on the eighth light emitting cell E2 to surround a distal end of the lower extension portion 35*b* and a portion of the side surface thereof. Although the primary upper extension portion 37*e* has a substantially similar shape to the primary upper extension portion 37*c*, the primary upper extension portion 37*e* has a shorter length due to the second electrode pad 35 located at a lower end of the eighth light emitting cell E2.

In FIG. 15, the first, fourth and seventh light emitting cells C1, D1, E1 may define a first group, the second, fifth and eighth light emitting cells C2, D2, E2 may define a second group, and the third, sixth and ninth light emitting cells C3, D3, E3 may define a third group. In each of the groups, the light emitting cells may be electrically connected to one another in series through the secondary upper extension portions 37*d* and the connecting portions 35*c* (on the fourth to ninth light emitting cells D1, D2, D3, E1, E2, E3). In addition, the first group, the second group and the third group may be electrically connected to one another in parallel through the secondary upper extension portions 37*a* and the linear region of the lower extension portion 35*a* in the horizontal direction.

FIG. 16 is a plan view of a light emitting diode according to yet another exemplary embodiment of the present disclosure.

Referring to FIG. 16, the light emitting diode according to this exemplary embodiment includes first to eighth light emitting cells C1, C2, D1, D2, E1, E2, F1, F2 disposed on a substrate 21. The light emitting diode further includes a first electrode pad 37, a second electrode pad 35, upper extension portions 37*a*, 37*b*, 37*c*, 37*d*, and lower extension portions 35*a*, 35*b*, 35*d*.

The first and second light emitting cells C1, C2 may be isolated from the third and fourth light emitting cells D1, D2 by an isolation groove 30*a*, and the third and fourth light emitting cells D1, D2 may be isolated from the fifth and sixth light emitting cells E1, E2 by an isolation groove 30*b*. In addition, the fifth and sixth light emitting cells E1, E2 may be isolated from the seventh and eighth light emitting cells F1, F2 by an isolation groove 30*c*. The isolation grooves 30*a*, 30*b*, 30*c* may be formed by an isolation process and may expose the substrate 21 there through. Meanwhile, the first light emitting cell C1, the third light emitting cell D1, the fifth light emitting cell E1, and the seventh light emitting cell F1 may be isolated from the second light emitting cell C2, the fourth light emitting cell D2, the sixth light emitting cell E2, and the eighth light emitting cell F2, respectively, by a mesa etching process in which a mesa isolation groove 27*a* is formed to expose the lower semiconductor layers 23*a*, 23*b*, 23*c*, 23*d*. In this structure, the first light emitting cell C1 and the second light emitting cell C2 may share a first lower semiconductor layer 23*a*; the third light emitting cell D1 and the fourth light emitting cell D2 may share a second lower semiconductor layer 23*b*; and the fifth light emitting cell E1 and the sixth light emitting cell E2 may share a third lower semiconductor layer 23*c*; and the seventh light emitting cell F1 and the eighth light emitting cell F2 may share a fourth lower semiconductor layer 23*d*. That is, the semiconductor stack including the lower semiconductor layers 23*a*, 23*b*, 23*c*, 23*d*, an active layer 25 and an upper semiconductor layer 27 is divided into the first to eighth light emitting cells C1, C2, D1, D2, E1, E2, F1, F2 by the mesa isolation groove 27*a* and the isolation grooves 30*a*, 30*b*, 30*c*.

Other electrode portions are not disposed in the mesa isolation groove 27*a* except for the first electrode pad 37 and the second electrode pad 35, and the lower semiconductor layers 23*a*, 23*b*, 23*c*, 23*d* may be exposed through the mesa isolation groove 27*a*. With reference to an imaginary line connecting the mesa isolation groove 27*a* or the first electrode pad 37 and the second electrode pad 35, the first light emitting cell C1 and the second light emitting cell C2, the third light emitting cell D1 and the fourth light emitting cell D2, the fifth light emitting cell E1 and the sixth light emitting cell E2, and the seventh light emitting cell F1 and the eighth light emitting cell F2 may have symmetrical structures, respectively. Thus, the following description will focus on the first, third, fifth and seventh light emitting cells C1, D1, E1, F1 disposed at the left of the light emitting diode.

The first, third, fifth and seventh light emitting cells C1, D1, E1, F1 may be electrically connected to one another in series. In addition, the second, fourth, sixth and eighth light emitting cells C2, D2, E2, F2 may be electrically connected to one another in series. Furthermore, the first, third, fifth and seventh light emitting cells C1, D1, E1, F1 may be electrically connected in parallel to the second, fourth, sixth and eighth light emitting cells C2, D2, E2, F2. With the structure wherein the plural light emitting cells are connected to one another in parallel, the light emitting diode can achieve uniform current spreading to each of the light emitting cells, thereby suppressing the droop phenomenon by reducing voltage increase during high current driving.

The first electrode pad 37 may be disposed near one edge 21*a* of the substrate 21 and the second electrode pad 35 may be disposed near the other edge 21*b* facing the one edge 21*a*. As shown in FIG. 16, the first electrode pad 37 may be disposed to face the second electrode pad 35. Furthermore, the first electrode pad 37 may be formed to straddle the first light emitting cell C1 and the second light emitting cell C2.

The shape of the first electrode pad 37 of FIG. 16 is similar to that of the first electrode pad of FIG. 1. A third current blocking layer 31*a* having a larger area than the first electrode pad 37 may be disposed under the first electrode pad 37. The first electrode pad 37 may be disposed only on the third current blocking layer 31*a*. The first electrode pad 37 may be disposed on the mesa isolation groove 27*a* to straddle the first light emitting cell C1 and the second light emitting cell C2. Accordingly, the third current blocking layer 31*a* may insulate the first electrode pad 37 from the first lower semiconductor layer 23*a* on the mesa isolation groove 27*a*. Further, the third current blocking layer 31*a* may be interposed between the transparent electrode layer 33 and the upper semiconductor layer 27 on the first and second light emitting cells C1, C2. Meanwhile, a part of the transparent electrode layer 33 is disposed under the first electrode pad 37. The transparent electrode layer 33 may include an opening 33*a* which exposes the third current blocking layer 31*a*. The openings 33*a* formed in transparent electrode layer 33 on the first light emitting cell C1 and the second light emitting cell C2 may be symmetrical to each other with respect to the mesa isolation groove 27*a*.

The opening 33a may have a semi-circular shape. With the structure wherein the opening 33a is formed in the transparent electrode layer 33, adhesion of the first electrode pad 37 can be improved. It should be understood that the opening 33a is not limited to the semi-circular shape and may have any shape so long as the opening can improve adhesion of the first electrode pad 37. Although the opening 33a is formed in the transparent electrode layer 33 in this exemplary embodiment, the opening 33a may be through the third current blocking layer 31a so as to expose the upper semiconductor layer 27.

The second electrode pad 35 may be disposed in the mesa isolation groove 27a near the other edge 21b of the substrate 21 to be electrically connected to the fourth lower semiconductor layer 23d. Meanwhile, the seventh light emitting cell F1 and the eighth light emitting cell F2 may be disposed near the second electrode pad 35. The second current blocking layer 31b may be disposed under the second electrode pad 35. The second current blocking layer 31b may be disposed between the second electrode pad 35 and the fourth lower semiconductor layer 23d to allow efficient horizontal spreading of electric current injected into the fourth lower semiconductor layer 23d. The second current blocking layer 31b may have a smaller area than the second electrode pad 35. That is, the second current blocking layer 31b may have smaller widths in the horizontal and vertical directions thereof than the second electrode pad 35 and thus may be restrictively disposed under some region of the second electrode pad 35. For example, the area of the second current blocking layer 31b may be restricted to 90% or less the area of the second electrode pad 35.

The insulating layer 32b may cover side surfaces of the seventh light emitting cell F1 and the eighth light emitting cell F2 near the second electrode pad 35. Referring to FIG. 16, the insulating layer 32b may also be formed at a portion through which the lower extension portion 35a passes while covering the side surfaces of the seventh light emitting cell F1 and the eighth light emitting cell F2 to form an entirely closed curve. The insulating layer 32b may be first formed at the portion through which the lower extension portion 35a passes, and then the lower extension portion 35a may be formed thereon. Accordingly, the lower extension portion 35a may have a higher height at a portion thereof, on which the insulating layer 32b is formed, than at other portions thereof. The insulating layer 32b can prevent a bonding material from contacting the upper semiconductor layer 27 of the seventh light emitting cell F1 or the eighth light emitting cell F2 and causing short circuit upon bonding of a wire to the second electrode pad 35. The insulating layer 32b may be separated from the transparent electrode layer 33 and thus may be formed to have a relatively very small area. With this structure, the light emitting diode can reduce light loss caused by the insulating layer 32b.

The lower semiconductor layers 23a, 23b, 23c, 23d may be exposed through the upper semiconductor layer 27 and the active layer 25 of each of the light emitting cells, and the lower extension portions 35a, 35b, 35d may be disposed on exposed regions of the lower semiconductor layers 23a, 23b, 23c, 23d. The lower extension portions 35a, 35b, 35d may be electrically connected to the lower semiconductor layers 23a, 23b, 23c, 23d.

Each of the lower extension portions 35b, 35d disposed on the first to sixth light emitting cells C1, C2, D1, D2, E1, E2 may include two linear regions (in the horizontal and vertical directions) and a curved region connecting the two linear regions to each other. The lower extension portion 35b formed on each of the first and fifth light emitting cells C1, E1 may be in mirror symmetry to the lower extension portion 35d formed on the third light emitting cell D1. Each of the lower extension portions 35b, 35d is connected at one end thereof to the connecting portion 35c to be electrically connected to a primary upper extension portion 37c or 37d of two light emitting cells adjacent to each other in the vertical direction, and has the other end surrounded by a curved region of the primary upper extension portion 37b, 37c or 37d, which is formed near the center thereof. For example, one end of the lower extension portion 35b formed on the first light emitting cell C1 may be connected to a secondary upper extension portion 37a of the third light emitting cell D1 through the connecting portion 35c. With this structure, the first light emitting cell C1 can be electrically connected in series to the third light emitting cell D1.

In addition, referring to FIG. 16, on the first light emitting cell C1, the lower extension portion 35b may vertically extend from a left lower end of the first light emitting cell C1 rather than from the center thereof and then may be bent towards the right side. On the third light emitting cell D1, the lower extension portion 35d may vertically extend from a right lower end of the third light emitting cell D1 and then may be bent towards the left side. Further, on the fifth light emitting cell E1, the lower extension portion 35b may vertically extend from a left lower end of the fifth light emitting cell E1 and then may be bent towards the right side. That is, unlike the exemplary light emitting diodes of FIG. 9 and FIG. 15, the light emitting diode according to this exemplary embodiment may include the lower extension portions 35b, 35d, each of which extends from the left or right side of the lower end of the light emitting cell rather than from the center thereof.

The lower extension portion 35a may be formed on the seventh and eighth light emitting cell F1, F2 and may be connected to the second electrode pad 35. The lower extension portion 35a may include a linear region and a curved region. The curved region of the lower extension portion 35a may connect the linear region thereof to the second electrode pad 35. Unlike the exemplary light emitting diodes of FIG. 9 and FIG. 15, the linear region of the lower extension portion 35a may be formed in the horizontal direction of the light emitting diode.

First current blocking layers 31c may be disposed under each of the lower extension portions 35a, 35b, 35d. The first current blocking layers 31c may be separated from each other. The first current blocking layers 31c may be disposed between each of the lower extension portions 35a, 35b, 35d and each of the lower semiconductor layers 23a, 23b, 23c, 23d to assist in horizontal spreading of electric current injected into the lower semiconductor layers 23a, 23b, 23c, 23d. Here, as in the exemplary embodiments of FIG. 9 and FIG. 15, the first current blocking layers 31c may not be disposed at the distal ends of the lower extension portions 35a, 35b, 35d.

Meanwhile, the upper extension portions 37a, 37b, 37c, 37d may be disposed on the transparent electrode layer 33. A primary upper extension portion 37b may extend from the first electrode pad 37 towards a left side 21c of the substrate 21 on the first light emitting cell C1 in the horizontal direction. Referring to FIG. 16, the primary upper extension portion 37b may include a round shape adjoining the first electrode pad 37 and two curved lines extending from the round shape in the horizontal direction. The primary upper extension portion 37b includes two distal ends and may be disposed to surround a distal end of the lower extension portion 35b and a portion of a side surface thereof. Thus, a region of the primary upper extension portion 37b may be disposed above the lower extension portion 35b and another region of the primary upper extension portion 37b may be disposed below the lower extension portion 35b. Herein, a region above the lower extension portion 35b refers to a region adjacent to one edge 21a of the substrate 21 and a region below the lower extension portion 35b refers to a region closer to the other edge 21b facing the one edge 21a of the substrate 21 with reference to the lower extension portion 35b. Although the primary upper extension portion 37b may have a substantially symmetrical structure with respect to the linear region of the lower extension portion 35b, an upper end of the primary upper extension portion 37b may be closer to the left edge 21c of the substrate 21 than a lower side thereof. That is, as shown in FIG. 16, the region of the primary upper extension portion 37b disposed above the lower extension portion 35b is larger than the region of the primary upper extension portion 37b disposed below the lower extension portion 35b and may be curved along the curved region of the lower extension portion 35b.

A secondary upper extension portion 37a may be formed at a left upper end or a right upper end of each of the third, fifth and seventh light emitting cells D1, E1, F1. The secondary upper extension portion 37a may have a linear shape in the vertical direction. The secondary upper extension portion 37a may be connected at one end thereof to the connecting portion 35c and at the other end thereof to the primary upper extension portion 37c or 37d. For example, on the third light emitting cell D1, the secondary upper extension portion 37a may be formed at the left upper end of the third light emitting cell D1 and may be connected at one end thereof to the connecting portion 35c to be electrically connected to the lower extension portion 35b of the first light emitting cell C1. In addition, the other end of the secondary upper extension portion 37a may be connected to the left upper end of the primary upper extension portion 37c of the third light emitting cell D1. With this structure, the first light emitting cell C1 may be electrically connected in series to the third light emitting cell D1 and the third light emitting cell D1 may also be electrically connected in series to the fifth light emitting cell E1.

A primary upper extension portion 37c is formed on each of the third and seventh light emitting cells D1, F1 and may extend from the left side 21c of the substrate 21 towards the mesa isolation groove 27a in the horizontal direction. The primary upper extension portion 37c has a substantially similar shape to the primary upper extension portion 37b formed on the first light emitting cell C1 and may have a mirror symmetry structure thereto. There are differences in a contact area between the primary upper extension portion 37b and the first electrode pad 37, and a contact area and contact location between the primary upper extension portion 37c and the secondary upper extension portion 37a. Referring to FIG. 16, it can be seen that the contact area between the upper extension portion 37b and the first electrode pad 37 is larger than the contact area between the primary upper extension portion 37c and the secondary upper extension portion 37a. Also, the primary upper extension portion 37c is disposed closer to the mesa isolation groove 27a. A primary upper extension portion 37d may be formed on the fifth light emitting cell E1 and may have a mirror symmetry structure with respect to the primary upper extension portion 37c.

The upper extension portions and the lower extension portions on the second, fourth, sixth and eighth light emitting cells C2, D2, E2, F2 may be symmetrical to the upper extension portions 37a, 37b, 37c, 37d and the lower extension portions 35a, 35b, 35d on the first, third, fifth and seventh light emitting cells C1, D1, E1, F1 with reference to an imaginary line connecting the mesa isolation groove 27a or the first electrode pad 37 to the second electrode pad 35.

FIG. 17 is a plan view of a light emitting diode according to yet another exemplary embodiment of the present disclosure.

Referring to FIG. 17, the light emitting diode according to this exemplary embodiment may include first to eighth light emitting cells C1, C2, D1, D2, E1, E2 disposed on the substrate 21. Further, the light emitting diode may include a first electrode pad 37, a second electrode pad 35, upper extension portions 37a, 37b, 37c, 37d, 37e, 37f, 37g, 37h, and lower extension portions 35a, 35b, 35d, 35e, 35f, 35g.

The light emitting cells C1, C2, D1, D2, E1, E2 may be isolated from one another by isolation grooves 30a, 30b, 30c. Specifically, the first and second light emitting cells C1, C2 may be isolated from the third and fourth light emitting cells D1, D2 by the isolation groove 30a, and the third and fourth light emitting cells D1, D2 may be isolated from the fifth and sixth light emitting cells E1, E2 by the isolation groove 30b. In addition, the first, third and fifth light emitting cells C1, D1, E1 may be isolated from the second, fourth and sixth light emitting cells C2, D2, E2 by the isolation groove 30c. That is, the semiconductor stack including lower semiconductor layers 23a, 23b, 23c, an active layer 25 and an upper semiconductor layer 27 is divided into the first to sixth light emitting cells C1, C2, D1, D2, E1, E2 by the isolation grooves 30a, 30b, 30c.

The isolation grooves 30a, 30b may be formed by an isolation process and may expose the substrate 21 there through. Each of the light emitting cells has a rectangular shape, the longitudinal length of which is greater than the transverse length thereof. The first to sixth light emitting cells C1, C2, D1, D2, E1, E2 may be electrically connected to one another in series. Referring to FIG. 17, the first electrode pad 37 is formed at a right upper side on the second light emitting cell C2 and the second electrode pad 35 is formed on a mesa groove 27b formed at a left lower side of the fifth light emitting cell E1. That is, on the substrate 21, the first electrode pad 37 and the second electrode pad 35 may be formed on a diagonal line. In addition, with reference to the isolation groove 30c, the first light emitting cell C1 may have a symmetrical structure with respect to the fourth light emitting cell D2, and the third light emitting cell D1 may have a symmetrical structure with respect to the sixth light emitting cell E2.

Specifically, the first electrode pad 37 may be formed at the right upper side of the second light emitting cell C2. A third current blocking layer 31a may be disposed under the first electrode pad 37. Specifically, the third current blocking layer 31a may be interposed between the transparent electrode layer 33 and the upper semiconductor layer 27 under the first electrode pad 37. The third current blocking layer 31a has a greater width than the first electrode pad 37 and thus can insulate the first electrode pad 37 from the first lower semiconductor layer 23a. A part of the transparent electrode layer 33 may be disposed under the first electrode pad 37. The transparent electrode layer 33 may include an opening 33a which exposes the third current blocking layer 31a. The opening 33a may have a circular shape. With the structure wherein the opening 33a is formed in the transparent electrode layer 33, adhesion of the first electrode pad 37 can be improved. It should be understood that the opening 33a is not limited to the circular shape and may have any shape so long as the opening can improve adhesion of the first electrode pad 37.

The second electrode pad 35 may be disposed in the mesa groove 27b. That is, in order to form the second electrode pad 35, some region at the left lower side of the fifth light emitting cell E1 is removed by mesa etching to form the mesa groove 27b. The second electrode pad 35 may be disposed in the mesa groove 27b to be electrically connected to a third lower semiconductor layer 23c.

A second current blocking layer 31b may be disposed under the second electrode pad 35. The second current blocking layer 31b is disposed between the second electrode pad 35 and the third lower semiconductor layer 23c to assist in efficient horizontal spreading of electric current injected into the third lower semiconductor layer 23c. The second current blocking layer 31b may have a smaller area than the second electrode pad 35. That is, the second current blocking layer 31b may have smaller widths in the horizontal and vertical directions thereof than the second electrode pad 35 and thus may be disposed in some region of the second electrode pad 35. For example, the area of the second current blocking layer 31b may be restricted to 90% or less the area of the second electrode pad 35.

The insulating layer 32b may cover a side surface of the mesa groove 27b. As shown in FIG. 17, the insulating layer 32b may also be formed at a portion through which the lower extension portion 35a passes while covering the side surface of the mesa groove 27b to have an entirely closed line shape. In addition, the insulating layer 32b may be first formed at the portion through which the lower extension portion 35a passes, and then the lower extension portion 35a may be formed thereon. Accordingly, the lower extension portion 35a may have a higher height at a portion thereof, on which the insulating layer 32b is formed, than at other portions thereof. The insulating layer 32b can prevent a bonding material from contacting the upper semiconductor layer 27 of the fifth light emitting cell E1 and causing short circuit upon bonding of a wire to the second electrode pad 35.

The lower semiconductor layers 23a, 23b, 23c may be exposed through the upper semiconductor layer 27 and the active layer 25 of each of the light emitting cells, and the lower extension portions 35a, 35b, 35d, 35e, 35f, 35g may be disposed on exposed regions of the lower semiconductor layers 23a, 23b, 23c. The lower extension portions 35a, 35b, 35d, 35e, 35f, 35g may be electrically connected to the lower semiconductor layers 23a, 23b, 23c.

The lower extension portion 35g is formed on the second light emitting cell C2 and has a linear shape. The lower extension portion 35g may be formed along a central line of the second light emitting cell C2. The lower extension portion 35g may be collinear with the linear region (horizontal direction) of the lower extension portion 35f of the first light emitting cell C1. The lower extension portion 35g may be connected at one end thereof to the connecting portion 35c to be electrically connected to a primary upper extension portion 37c of the first light emitting cell C1. With this structure, the second light emitting cell C2 may be electrically connected in series to the first light emitting cell C1. The other end of the lower extension portion 35g may be surrounded by the primary upper extension portion 37b. In this exemplary embodiment, since the first electrode pad 37 is formed on the second light emitting cell C2, the lower extension portion 35g may have a relatively short length.

The lower extension portion 35f is formed on the first light emitting cell C1 and may include two linear regions (in the horizontal and vertical directions) and a curved region connecting the two linear regions to each other. The linear region of the lower extension portion 35f in the vertical direction is disposed at a left lower side of the first light emitting cell C1, and may be connected at one end thereof to the connecting portion 35c to be connected to a secondary upper extension portion 37a of the third light emitting cell D1 and at the other end thereof to the curved region thereof. With this structure, the first light emitting cell C1 may be electrically connected in series to the third light emitting cell D1. In order to form the linear region of the lower extension portion 35f in the vertical direction, some region at the left lower side of the first light emitting cell C1 may be removed by mesa etching. In addition, the linear region of the lower extension portion 35f in the horizontal direction may be formed along the central line of the first light emitting cell C1, and may be connected at one end thereof to the curved region thereof and may have the other end surrounded by a primary upper extension portion 37c.

The lower extension portion 35e is formed on the third light emitting cell D1 and may include a linear shape. The lower extension portion 35e may be formed along a central line of the third light emitting cell D1. The lower extension portion 35e may be collinear with the linear region (horizontal direction) of the lower extension portion 35d of the fourth light emitting cell D2. The lower extension portion 35e may be connected at one end thereof to the connecting portion 35c to be electrically connected to the secondary upper extension portion 37h of the fourth light emitting cell D2. With this structure, the third light emitting cell D1 may be electrically connected in series to the fourth light emitting cell D2. The other end of the lower extension portion 35e may be surrounded by the primary upper extension portion 37d.

The lower extension portion 35d is formed on the fourth light emitting cell D2 and may have a symmetrical structure to the lower extension portion 35f formed on the first light emitting cell C1 with reference to the isolation groove 30c.

The lower extension portion 35a is formed on the fifth light emitting cell E1 and may include a curved region and a linear region. The curved region of the lower extension portion 35a may be connected at one end thereof to the second electrode pad 35 and at the other end thereof to one end of the linear region of the lower extension portion 35a. The other end of the linear region of the lower extension portion 35a may be surrounded by a primary upper extension portion 37g. In addition, the linear region of the lower extension portion 35a may be formed at the center of the fifth light emitting cell E1.

The lower extension portion 35b is formed on the sixth light emitting cell E2 and may have a symmetrical structure to the lower extension portion 35e formed on the third light emitting cell D1 with reference to the isolation groove 30c.

First current blocking layers 31c may be disposed under each of the lower extension portions 35a, 35b, 35d, 35e, 35f, 35g. The first current blocking layers 31c may be separated from each other. The first current blocking layers 31c may be disposed between each of the lower extension portions 35a, 35b, 35d, 35e, 35f, 35g and each of the lower semiconductor layers 23a, 23b, 23c to assist in horizontal spreading of electric current injected into the lower semiconductor layers 23a, 23b, 23c. Here, the first current blocking layers 31c may not be disposed at the distal ends of the lower extension portions 35a, 35b, 35d, 35e, 35f, 35g.

Meanwhile, the upper extension portions 37a, 37b, 37c, 37d, 37e, 37f, 37g, 37h may be disposed on the transparent electrode layer 33. A primary upper extension portion 37b may extend from the first electrode pad 37 towards the isolation groove 30c on the second light emitting cell C2. The primary upper extension portion 37b may be disposed to surround the distal end of the lower extension portion 35g and a portion of a side surface thereof. Accordingly, a portion of the primary upper extension portion 37b may be disposed above the lower extension portion 35g, another portion thereof may be disposed below the lower extension portion 35g, and a third portion thereof may be disposed between the distal end of the lower extension portion 35g and an edge 21d of the substrate 21. In addition, the primary upper extension portion 37b has two ends, which are disposed above and below the lower extension portion 35g, respectively. Herein, a region above the lower extension portion 35g refers to a region adjacent to one edge 21a of the substrate 21 and a region below the lower extension portion 35g refers to a region adjacent to the isolation groove 30a. The distance between the primary upper extension portion 37b and the lower extension portion 35g may be variable. For example, the distance between the primary upper extension portion 37b and the lower extension portion 35g may increase and then decrease along an imaginary line extending from the primary upper extension portion 37b.

The primary upper extension portion 37c may extend from the isolation groove 30c towards the left side 21c of the substrate 21 on the first light emitting cell C1 in the horizontal direction. The primary upper extension portion 37c may have a curved shape. The primary upper extension portion 37c may be disposed to surround a distal end of the lower extension portion 35f and a portion of a side surface thereof (in the horizontal direction). Accordingly, a portion of the primary upper extension portion 37c may be disposed above the lower extension portion 35f, another portion thereof may be disposed below the lower extension portion 35f, and a third portion thereof may be disposed between the distal end of the lower extension portion 35f and the isolation groove 30c. In addition, the primary upper extension portion 37c has two ends, which may be disposed above and below the lower extension portion 35f, respectively. The primary upper extension portion 37c may have a symmetrical structure with reference to an imaginary line extending from the linear region of the lower extension portion 35f.

The primary upper extension portion 37c is formed on the first light emitting cell C1 and is similar to a primary upper extension portion 37f of the sixth light emitting cell E2 excluding a region thereof to which the secondary upper extension portion 37a is connected. In addition, primary upper extension portions 37d, 37e are formed on the third light emitting cell D1 and the fourth light emitting cell D2, respectively, and may be substantially in mirror symmetry to the primary upper extension portion 37c excluding a region thereof to which the secondary upper extension portion 37a or 37h is connected.

A primary upper extension portion 37g may extend from the isolation groove 30c towards the left side 21c of the substrate 21 on the fifth light emitting cell E1 in the horizontal direction. The primary upper extension portion 37g may be disposed to surround the distal end of the lower extension portion 35a and a portion of a side surface thereof. Accordingly, a portion of the primary upper extension portion 37g may be disposed above the lower extension portion 35a, another portion thereof may be disposed below the lower extension portion 35a, and a third portion thereof may be disposed between the distal end of the lower extension portion 35a and the isolation groove 30c. The distance between the primary upper extension portion 37g and the lower extension portion 35a may be variable. For example, the distance between the primary upper extension portion 37g and the lower extension portion 35a may increase and then decrease along an imaginary line extending from the primary upper extension portion 37g. Although the primary upper extension portion 37g may have a substantially symmetrical structure with respect to the linear region of the lower extension portion 35a, an upper end of the lower extension portion 35a may be disposed closer to the left side 21c of the substrate 21 than a lower end thereof. That is, as shown in FIG. 17, a region of the primary upper extension portion 37g disposed above the lower extension portion 35a has a greater length than a region of the primary upper extension portion 37g disposed below the lower extension portion 35a, and the primary upper extension portion 37g may be curved along the curved region of the lower extension portion 35a.

Meanwhile, the secondary upper extension portion 37a formed on each of the third and sixth light emitting cells D1, E2 may connect the lower extension portion to the primary upper extension portion between two light emitting cells adjacent to each other in the vertical direction. For example, the secondary upper extension portion 37a formed on the third light emitting cell D1 may be connected at one end thereof to the connecting portion 35c to be electrically connected to the lower extension portion 35f formed on the first light emitting cell C1. In addition, the other end of the secondary upper extension portion 37a formed on the third light emitting cell D1 may be connected to the primary upper extension portion 37d. With this structure, the first light emitting cell C1 may be electrically connected in series to the third light emitting cell D1. The secondary upper extension portion 37a extends at an angle from one side of an upper end of the light emitting cell towards a right or left lower end thereof to be connected to the primary upper extension portion 37d or 37f.

Further, the secondary upper extension portion 37h formed on each of the first, fourth and fifth light emitting cells C1, D2, E1 may connect the lower extension portion to the primary upper extension portion between two light emitting cells adjacent to each other in the horizontal direction. For example, the secondary upper extension portion 37h formed on the first light emitting cell C1 may be connected at one end thereof to the connecting portion 35c to be electrically connected to the lower extension portion 35g formed on the second light emitting cell C2. In addition, the other end of the secondary upper extension portion 37h formed on the first light emitting cell C1 may be connected to the center of the primary upper extension portion 37c. With this structure, the first light emitting cell C1 may be electrically connected in series to the second light emitting cell C2. The secondary upper extension portion 37h have a linear shape and may be disposed collinear with the lower extension portion 35b, 35e or 35g.

Figure 18A:
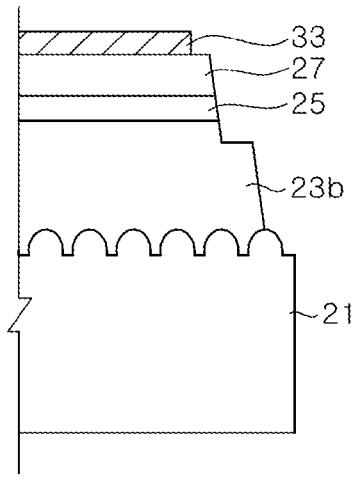
FIG. 18A, FIG. 18B, and FIG. 18C are sectional views of the light emitting diodes according to the exemplary embodiments of the present disclosure, showing side surfaces thereof.
Figure 18B:
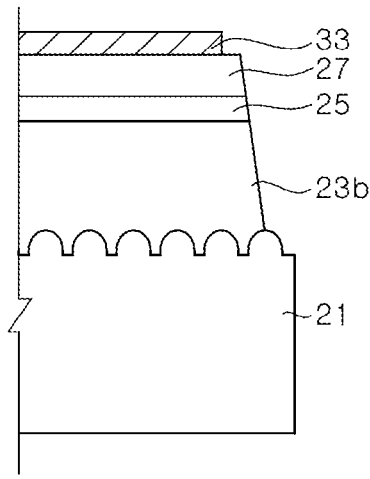
Figure 18C:
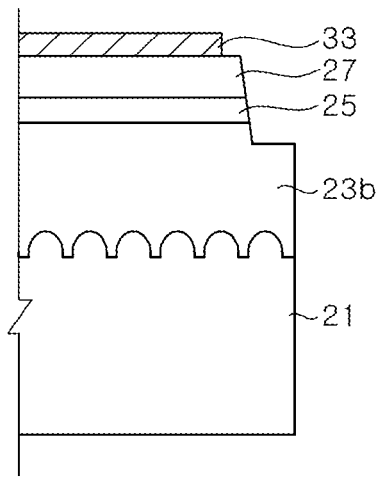

FIG. 18A, FIG. 18B, and FIG. 18C are sectional views of the light emitting diodes according to the exemplary embodiments of the present disclosure, showing side surfaces thereof. Embodiments of a side surface of a substrate shown in FIG. 18A, FIG. 18B, and FIG. 18C may be applied to side surfaces of the light emitting diodes shown in FIG. 1, FIG. 9 and FIG. 15 to FIG. 17.

Specifically, on the side surface of the light emitting diode shown in FIG. 18A, a patterned substrate 21 is exposed and a semiconductor stack has steps formed thereon. The patterned substrate 21 is exposed through an isolation process and the steps are formed by mesa etching. That is, first, the patterned substrate 21 is exposed on the side surface of the light emitting diode through the isolation process, and a step is then formed on the lower semiconductor layer 23b through mesa etching. The steps formed on the semiconductor stack can improve coupling force upon metal deposition.

On the side surface of the light emitting diode shown in FIG. 18B, the patterned the substrate 21 is exposed and the semiconductor stack does not have a step, unlike the light emitting diode shown in FIG. 18A. This structure is obtained by performing the isolation process subsequent to mesa etching, unlike FIG. 18A.

On the side surface of the light emitting diode shown in FIG. 18C, the substrate 21 is not exposed and the semiconductor stack has steps formed thereon, unlike FIG. 18A and FIG. 18B. This structure is obtained by mesa etching alone without performing the isolation process with respect to the side surface of the light emitting diode. Since the semiconductor stack, that is, a luminous area, is inevitably removed during the isolation process, the side surface of the light emitting diode shown in FIG. 18C can secure as large a luminous area as possible by omitting the isolation process.

The light emitting diode according to the exemplary embodiments can be operated at a relatively high voltage using the light emitting cells connected to each other in series. As a result, the light emitting diode according to the exemplary embodiments can reduce overall driving current. Furthermore, the light emitting diode according to the exemplary embodiments can achieve uniform current spreading using the light emitting cells connected to each other in parallel, and the lower extension portions and the upper extension portions. Furthermore, the light emitting diode according to the exemplary embodiments can be packaged by a typical packaging process, and a wavelength conversion layer containing phosphors may be disposed on the light emitting diode. As a result, it is possible to provide a light emitting device emitting white light.

Figure 19:
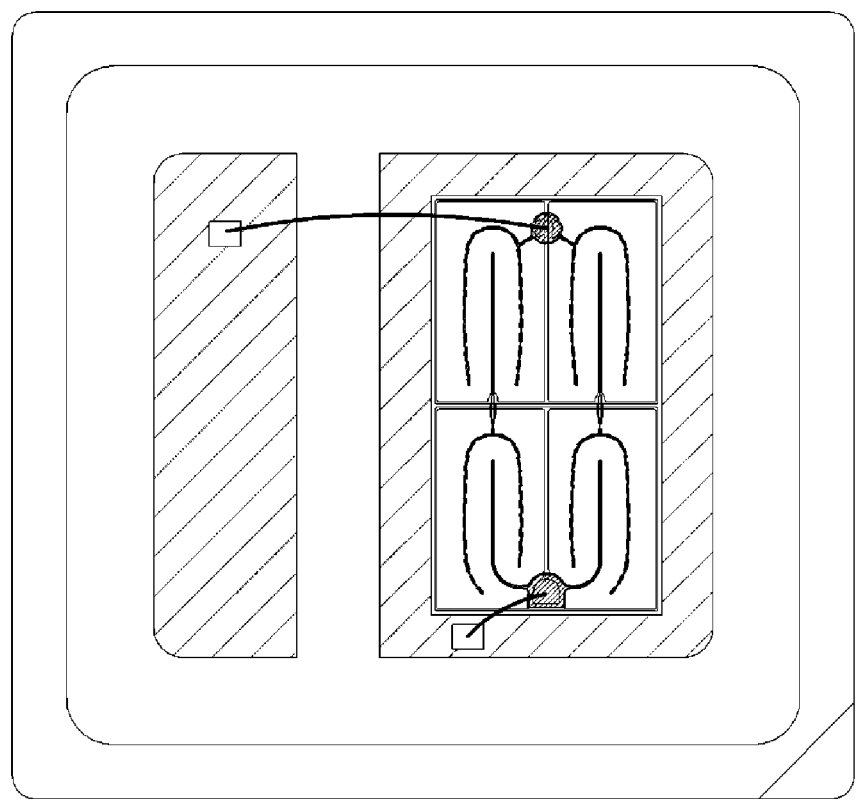
FIG. 19 is a top view of light emitting diodes according to exemplary embodiments of the present disclosure, showing a package mounting structure.

FIG. 19 is a top view of light emitting diodes according to exemplary embodiments of the present disclosure, showing a package mounting structure. FIG. 19 shows a package of the light emitting diode shown in FIG. 9 bonded to a lead frame through wire bonding. It should be understood that the light emitting diodes of FIG. 1 and FIG. 15 to FIG. 17 may also be packaged instead of the light emitting diode shown in FIG. 9.

Although certain exemplary embodiments have been described herein, it should be understood by those skilled in the art that these embodiments are given by way of illustration only, and that various modifications, variations, and alterations can be made without departing from the spirit and scope of the inventive concepts. Therefore, the scope of the inventive concepts should be limited only by the accompanying claims and equivalents thereof.

What is claimed is:
1. A light emitting diode comprising:
a substrate;
a semiconductor stack, wherein the semiconductor stack is disposed on the substrate, and the semiconductor stack further comprises a lower semiconductor layer, an upper semiconductor layer, an active layer, and an isolation groove, wherein the active layer is interposed between the lower semiconductor layer and the upper semiconductor layer, and the isolation groove exposes the substrate through the upper semiconductor layer, the active layer and the lower semiconductor layer;
a first electrode pad;
an upper extension portion, wherein the upper extension portion and the first electrode pad both electrically connected to the upper semiconductor layer;
a second electrode pad;
a lower extension portion, wherein the lower extension portion and the second electrode pad both electrically connected to the lower semiconductor layer;
a connecting portion, wherein the connecting portion connects the upper extension portion and the lower extension portion to each other across the isolation groove, a width of the connecting portion is greater than a width of the upper extension portion and a width the lower extension portion;
a first current blocking layer, wherein the first current blocking layer is interposed between the lower extension portion and the lower semiconductor layer, wherein the first current blocking layer further comprises a plurality of dots separated from one another, a width of each of the dots is greater than a width of the lower extension portion; and
a second current blocking layer, wherein the second current blocking layer is interposed between the second electrode pad and the lower semiconductor layer, wherein a width of the second current blocking layer is smaller than a width of the second electrode pad, and a shortest distance, which is from the isolation groove to the dot that is closest to the isolation groove, is greater than a separation distance between the two adjacent dots.

2. The light emitting diode of claim 1, wherein a first connection region and a second connection region are disposed in the first connection region, the connecting portion and the lower extension portion are connected to the lower semiconductor layer between the isolation groove and the dot that is closest to the isolation groove in the second connection region, the lower extension portion is connected to the lower semiconductor layer between the two adjacent dots, and a length of the first connection region is greater than a length of the second connection region.

3. The light emitting diode of claim 1, wherein the lower extension portion further comprises a distal end, and the upper extension portion is disposed to surround the distal end.

4. The light emitting diode of claim 3, wherein the distal end is directly connected to the lower semiconductor layer.

5. The light emitting diode of claim 4, wherein:
a horizontal distance comprises a distance from the distal end of the lower extension portion to the upper extension portion in a horizontal direction that is parallel to the substrate,
a diagonal distance comprises a distance from the distal end of the lower extension portion to the upper extension portion in a slanted direction with respect to the vertical direction, and
the diagonal distance is greater than the horizontal distance.

6. The light emitting diode of claim 1, wherein the first current blocking layer and the second current blocking layer further comprise an $SiO_2$ layer.

7. The light emitting diode of claim 1, further comprising:
a transparent electrode layer disposed on the upper semiconductor layer,
wherein a portion of the transparent electrode layer is disposed between the upper semiconductor layer and the first electrode pad, and between the upper semiconductor layer and the upper extension portion.

8. The light emitting diode of claim 7, further comprising:
a third current blocking layer disposed between the upper semiconductor layer and the transparent electrode layer, and under the first electrode pad.

9. The light emitting diode of claim 8, wherein the first electrode pad is connected to the third current blocking layer through an opening in the transparent electrode layer.

10. The light emitting diode of claim 9, wherein an area of the third current blocking layer in a horizontal direction is larger than an area of the first electrode pad, and the first electrode pad is disposed on the third current blocking layer.

11. The light emitting diode of claim 1, wherein the semiconductor stack further comprises a mesa isolation groove exposing the lower semiconductor layer,
the semiconductor stack further comprises a plurality of light emitting cells, wherein the plurality of light emitting cells are defined by the isolation groove, and the lower extension portion and the upper extension portion are disposed on each of the plurality of light emitting cells.

12. The light emitting diode of claim 11, wherein the plurality of light emitting cells are defined by the mesa isolation groove, and the lower extension portion and the upper extension portion are disposed on each of the plurality of light emitting cells.

13. The light emitting diode of claim 12, wherein the connecting portion electrically connects the upper extension portion and the lower extension portion of two adjacent light emitting cells.

14. The light emitting diode of claim 13, wherein the plurality of light emitting cells further comprise a first light emitting cell, a second light emitting cell, a third light emitting cell, and fourth light emitting cell;
the lower semiconductor layer further comprises a first lower semiconductor layer and a second lower semiconductor layer, wherein the first lower semiconductor layer and the second lower semiconductor layer are separated from each other by the isolation groove;
the first light emitting cell and the second light emitting cell share the first lower semiconductor layer;
the third light emitting cell and the fourth light emitting cell share the second lower semiconductor layer;
the first light emitting cell is connected in series to the third light emitting cell through the connecting portion; and
the second light emitting cell is connected in series to the fourth light emitting cell through the connecting portion.

15. The light emitting diode of claim 14, wherein the lower extension portions of each of the plurality of light emitting cells further comprises a linear region, wherein the plurality of linear regions extends in the same direction,
the linear region of the lower extension portion of the first light emitting cell is coaxial with the linear region of the lower extension portion of the third light emitting cell,
the linear region of the lower extension portion of the second light emitting cell is coaxial with the linear region of the lower extension portion of the fourth light emitting cell.

16. The light emitting diode of claim 15, wherein the first electrode pad is disposed on the mesa isolation groove to straddle the first light emitting cell and the second light emitting cell, and the second electrode pad is disposed on the mesa isolation groove to be electrically connected to the second lower semiconductor layer.

17. The light emitting diode of claim 16, wherein the upper extension portion of the first light emitting cell and the upper extension portion of the second light emitting cell are electrically connected to the first electrode pad, and the lower extension portion of the third light emitting cell and the lower extension portion of the fourth light emitting cell are electrically connected to the second electrode pad.

18. The light emitting diode of claim 17, wherein the upper extension portion of each of the plurality of light emitting cells further comprises a primary upper extension portion, and a secondary upper extension portion; and
wherein the primary upper extension portion is configured to surround a portion of the lower extension portion that corresponds with the primary upper extension portion, and the secondary upper extension portion protrudes from the primary upper extension portion.

19. The light emitting diode of claim 18, wherein the secondary upper extension portion on the first light emitting cell and the secondary upper extension portion on the second light emitting cell are disposed to connect the primary upper extension portion of the first light emitting cell and the primary upper extension portion of the second light emitting cell to the first electrode pad, and
the secondary upper extension portion on the third light emitting cell and the secondary upper extension portion on the fourth light emitting cell are disposed to connect the primary upper extension portion on the third light emitting cell and the primary upper extension portion of the fourth light emitting cell to the lower extension portion of the first light emitting cell and the lower extension portion of the second light emitting cell, respectively.

20. The light emitting diode of claim 19, wherein the first light emitting cell is connected in parallel to the second light emitting cell through the first electrode pad, and the third light emitting cell is connected in parallel to the fourth light emitting cell through the second electrode pad.

21. The light emitting diode of claim 6, wherein the first current blocking layer and the second current blocking layer further comprise a distributed Bragg reflector layer.

* * * * *

UNITED STATES PATENT AND TRADEMARK OFFICE
CERTIFICATE OF CORRECTION

PATENT NO.          : 10,181,548 B2
APPLICATION NO.     : 15/490492
DATED               : January 15, 2019
INVENTOR(S)         : Keum Ju Lee et al.

It is certified that error appears in the above-identified patent and that said Letters Patent is hereby corrected as shown below:

On the Title Page

Please list item (30) Foreign Application Priority Data as:
"April 18, 2016 (KR) ------ 10-2016-0047054", "November 10, 2016 (KR) ------ 10-2016-0149627", and "February 14, 2017 (KR) ------ 10-2017-0020233".

Signed and Sealed this
Twelfth Day of November, 2019

Andrei Iancu
*Director of the United States Patent and Trademark Office*